United States Patent
Yoshida et al.

(10) Patent No.: US 9,136,194 B2
(45) Date of Patent: Sep. 15, 2015

(54) RESIN COMPOSITION FOR ENCAPSULATION AND ELECTRONIC DEVICE USING THE SAME

(71) Applicant: SUMITOMO BAKELITE CO., LTD., Tokyo (JP)

(72) Inventors: Kenji Yoshida, Tokyo (JP); Ken Ukawa, Toyko (JP); Yusuke Tanaka, Tokyo (JP)

(73) Assignee: SUMITOMO BAKELITE CO., LTD., Tokyo (JP)

( * ) Notice: Subject to any disclaimer, the term of this patent is extended or adjusted under 35 U.S.C. 154(b) by 0 days.

(21) Appl. No.: 14/371,308

(22) PCT Filed: Feb. 26, 2013

(86) PCT No.: PCT/JP2013/001088
§ 371 (c)(1),
(2) Date: Jul. 9, 2014

(87) PCT Pub. No.: WO2013/136685
PCT Pub. Date: Sep. 19, 2013

(65) Prior Publication Data
US 2015/0054180 A1    Feb. 26, 2015

(30) Foreign Application Priority Data

Mar. 16, 2012 (JP) ................................ 2012-061136
Mar. 16, 2012 (JP) ................................ 2012-061137

(51) Int. Cl.
*H01L 23/29* (2006.01)
*C08L 63/00* (2006.01)
*C08G 59/24* (2006.01)
*C08G 59/32* (2006.01)
*C08G 59/62* (2006.01)
*C09D 163/00* (2006.01)
*H01L 23/31* (2006.01)
*H01L 23/00* (2006.01)

(52) U.S. Cl.
CPC .............. *H01L 23/293* (2013.01); *C08G 59/24* (2013.01); *C08G 59/3218* (2013.01); *C08G 59/621* (2013.01); *C08L 63/00* (2013.01); *C09D 163/00* (2013.01); *H01L 23/3107* (2013.01); *H01L 24/45* (2013.01); *H01L 2224/32245* (2013.01); *H01L 2224/45124* (2013.01); *H01L 2224/45139* (2013.01); *H01L 2224/45144* (2013.01); *H01L 2224/45147* (2013.01); *H01L 2224/48091* (2013.01); *H01L 2224/48247* (2013.01); *H01L 2224/73265* (2013.01); *H01L 2924/10253* (2013.01)

(58) Field of Classification Search
CPC .............. H01L 23/293; H01L 23/3107; H01L 2224/45139; H01L 2224/45124; H01L 2224/45144; H01L 2224/45147; H01L 2224/48091; H01L 2224/48247; H01L 2224/73265; H01L 2224/32245; H01L 24/45; C09D 163/00; C08G 59/245; C08G 59/3218; C08G 59/621; C08L 63/00
See application file for complete search history.

(56) References Cited

U.S. PATENT DOCUMENTS

| | | | |
|---|---|---|---|
| 6,242,110 B1 * | 6/2001 | Iwasaki et al. | 428/620 |
| 2010/0258817 A1 | 10/2010 | Nakayama et al. | |

FOREIGN PATENT DOCUMENTS

| | | |
|---|---|---|
| JP | 4-255714 A | 9/1992 |
| JP | 4-359919 A | 12/1992 |
| JP | 7-292066 A | 11/1995 |
| JP | 2005-167035 A | 6/2005 |
| JP | 2005-314525 | * 11/2005 |
| JP | 2005-314525 A | 11/2005 |
| JP | 5104308 | * 12/2012 |
| JP | 2013-43958 A | 3/2013 |
| WO | WO 2007/007827 A1 | 1/2007 |
| WO | WO 2011/074517 A1 | 6/2011 |

OTHER PUBLICATIONS

International Search Report issued in PCT/JP2013/001088, mailed on May 7, 2013.
Partial English translation of JP 4-255714 (Sep. 10, 1992).
Partial English translation of JP 4-359919 (Dec. 14, 1992).

* cited by examiner

*Primary Examiner* — Robert Jones, Jr.
(74) *Attorney, Agent, or Firm* — Birch, Stewart, Kolasch & Birch, LLP

(57) ABSTRACT

The present invention provides a resin composition for encapsulating electronic components that contains a phenol resin curing agent and an epoxy resin, in which either the phenol resin curing agent or the epoxy resin has a biphenyl structure; a resin composition for encapsulating electronic components that contains a phenol resin curing agent and an epoxy resin, in which a glass transition temperature of a cured material is equal to or higher than 200° C., and a weight reduction rate of the cured material is equal to or lower than 0.3%; and an electronic device that includes an electronic component encapsulated with the resin composition.

14 Claims, 1 Drawing Sheet

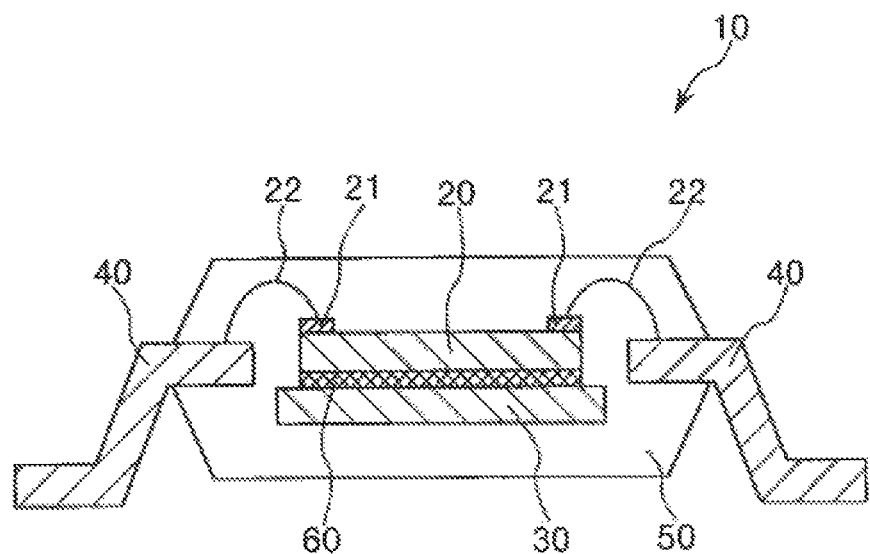

RESIN COMPOSITION FOR ENCAPSULATION AND ELECTRONIC DEVICE USING THE SAME

TECHNICAL FIELD

The present invention relates to a resin composition for encapsulation and an electronic device using the same. More specifically, the present invention relates to, for example, a resin composition which is for encapsulating an electronic component such as a semiconductor and an electronic device which includes the electronic component encapsulated with the resin composition.

BACKGROUND ART

In recent years, from the viewpoint of effective utilization of electric energy and the like, an SIC/GaN power semiconductor device equipped with an element using silicon carbide (SIC) and gallium nitride (GaN) has drawn attention (for an example, see Patent Document 1).

Compared to elements that uses Si in the related art, the aforementioned element can not only greatly reduce power loss but also operate at a higher voltage or current and at a high temperature equal to or higher than 200° C. Accordingly, the element is expected to be used in the field to which a Si power semiconductor device in the related art cannot be applied.

Such an element, which is represented by the element (semiconductor element) using SiC/GaN and can operate under harsh conditions, is required to exhibit a higher degree of heat resistance with respect to semiconductor encapsulating materials that are provided to semiconductor devices for protecting the element, compared to the elements in the related art.

In the Si power semiconductor device in the related art, from the viewpoint of adhesiveness, electric stability, and the like, a resin composition that contains a cured material of an epoxy-based resin composition as a main component is used as the semiconductor encapsulating material.

As an index indicating heat resistance of the cured material of a resin composition, a glass transition temperature (Tg) is generally used. This is because the resin composition for encapsulation (cured material) is in the form of rubber in a region having a temperature equal to or higher than Tg, and as a result, the strength or adhesive strength thereof decreases. Therefore, as methods of increasing Tg, techniques such as decreasing an epoxy group equivalent of an epoxy resin contained in a resin composition or decreasing a hydroxyl equivalent of a curing agent (phenol resin curing agent) so as to increase crosslink density, making a rigid structure that links these functional groups (an epoxy group and a hydroxyl group) with each other, and the like are adopted.

In addition to Tg, as an index indicating heat resistance of a resin composition, a weight reduction rate yielded by thermal decomposition is used. The weight of a resin composition is reduced by thermal decomposition caused in a portion in which an epoxy resin and a curing agent are linked to each other with weak bond energy. Accordingly, for a semiconductor encapsulating material having a high functional group density, it is disadvantageous to decrease the weight reduction rate. Therefore, the technique for decreasing the weight reduction rate and the technique for obtaining a high Tg as described above are used for opposed purposes.

Accordingly, in order to enhance heat resistance of a resin composition, it is desirable to design a resin structure, which is formed of an epoxy resin and a curing agent, and a functional group density under optimal conditions so as to obtain a high Tg. Moreover, it is desirable to form a resin composition designed to have a low weight reduction rate.

Moreover, in recent years, in the field of semiconductor and electronic component, improving continuous moldability which significantly influences productivity has become an urgent priority. In this respect, it is desired to improve not only the above characteristics but also the problem in that the semiconductor encapsulating material is incompletely filled in the semiconductor device due to mold contamination caused during continuous molding, clogging of air vent caused by residual burrs, and the like.

RELATED DOCUMENT

Patent Document

[Patent Document 1] Japanese Unexamined Patent Publication No. 2005-167035

DISCLOSURE OF THE INVENTION

The present invention has been made based on the above circumstances, and provides a resin composition capable of forming semiconductor encapsulating materials in which adhesiveness, electric stability, flame retardancy, moldability, and heat resistance are well balanced. Particularly, the present invention provides a resin composition in which both the increase of Tg and the decrease of weight reduction are established in regard to the heat resistance. The present invention also provides an electronic device obtained by encapsulating an electronic component with such a resin composition.

According to the present invention, there is provided a resin composition for encapsulation containing a phenol resin curing agent and an epoxy resin, in which the phenol resin curing agent is a phenol resin curing agent represented by Formula (1A), or the epoxy resin is an epoxy resin represented by Formula (2A).

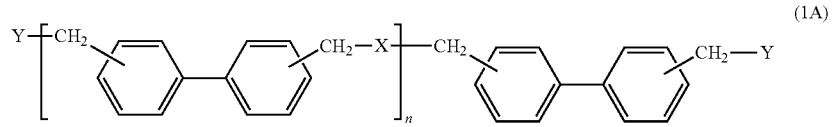

(1A)

(In Formula (1A), each of two Ys independently represents a hydroxyphenyl group represented by Formula (1B) or Formula (1C); X represents a hydroxyphenylene group represented by Formula (1D) or Formula (1E); n represents a number equal to or greater than 0; and when n is equal to or greater than 2, each of two or more Xs may be independently the same as or different from each other.)

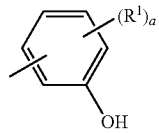
(1B)

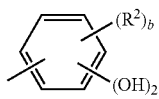
(1C)

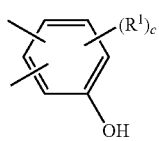
(1D)

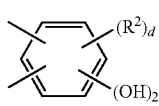
(1E)

(In Formulae (1B) to (1E), each of $R^1$ and $R^2$ independently represents a hydrocarbon group having 1 to 5 carbon atoms; a represents an integer of 0 to 4; b represents an integer of 0 to 3; c represents an integer of 0 to 3; and d represents an integer of 0 to 2.)

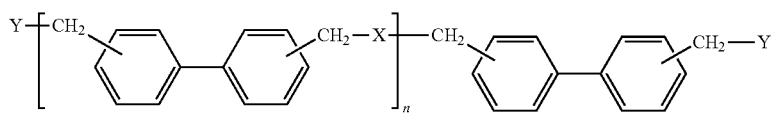
(2A)

(In Formula (2A), each of two Ys independently represents a glycidylated phenyl group represented by Formula (28) or Formula (2C); X represents a glycidylated phenylene group represented by Formula (2D) or Formula (2E); n represents a number equal to or greater than 0; and when n is equal to or greater than 2, each of two or more Xs may be independently the same as or different from each other.)

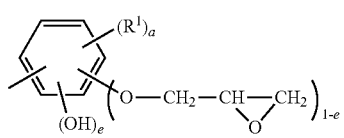
(2B)

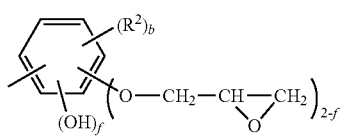
(2C)

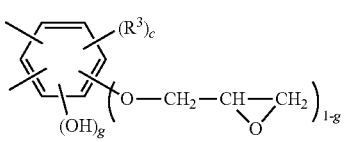
(2D)

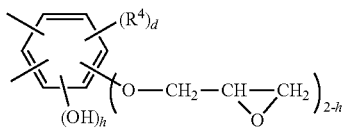
(2E)

(In Formulae (2B) to (2E), each of $R^1$, $R^2$, $R^3$, and $R^4$ independently represents a hydrocarbon group having 1 to 5 carbon atoms; a represents an integer of 0 to 4; b represents an integer of 0 to 3; c represents an integer of 0 to 3; d represents an integer of 0 to 2; each of e and g independently represents an integer of 0 or 1; and each of f and h independently represents an integer of 0 to 2.)

According to the present invention, there is provided a resin composition for encapsulation containing a phenol resin curing agent and an epoxy resin, in which a glass transition temperature (Tg) of a cured material of the resin composition for encapsulation is equal to or higher than 200° C., and when the cured material is heated for 1,000 hours at 200° C. in the atmosphere, a weight reduction rate of the cured material becomes equal to or lower than 0.3%.

According to an embodiment of the present invention, in the resin composition for encapsulation, the phenol resin curing agent is a phenol resin curing agent represented by the Formula (1A), and a hydroxyl equivalent of the phenol resin curing agent is equal to or more than 90 g/eq and equal to or less than 190 g/eq.

According to an embodiment of the present invention, in the resin composition for encapsulation, the epoxy resin is an epoxy resin represented by the Formula (2A), and an epoxy equivalent of the epoxy resin is equal to or more than 160 g/eq and equal to or less than 290 g/eq.

According to an embodiment of the present invention, in the resin composition for encapsulation, the epoxy resin is an epoxy resin represented by Formula (2A), and provided that a total number of glycidyl ether group contained in the epoxy resin is M, and a total number of hydroxyl group contained in the epoxy resin is N, a value of M/(M+N) is equal to or greater than 0.50 and equal to or less than 0.97.

According to an embodiment of the present invention, in the resin composition for encapsulation, the phenol resin is a phenol resin curing agent represented by the Formula (1A), and the epoxy resin is an epoxy resin represented by the Formula (2A).

Moreover, according to an embodiment of the present invention, in the resin composition for encapsulation, provided that a content of the phenol resin curing agent in the resin composition is A1 (% by mass), and a content of the epoxy resin in the resin composition is A2 (% by mass), a value of A1/(A1+A2) is equal to or greater than 0.2 and equal to or less than 0.9.

According to an embodiment of the present invention, the resin composition for encapsulation has a Koka's viscosity of equal to or higher than 1 Pa·s and equal to or lower than 14 Pa·s.

According to an embodiment of the present invention, a cured material of the resin composition for encapsulation has a flexural modulus at 260° C. of equal to or greater than 1500 N/mm² and equal to or less than 2500 N/mm².

According to an embodiment of the present invention, the resin composition for encapsulation has a water absorption rate of equal to or higher than 0.1% and equal to or lower than 0.35%.

Moreover, according to the present invention, there is provided an electronic device including an electronic component encapsulated with the resin composition for encapsulation.

In the present invention, at least one of the phenol resin curing agent and the epoxy resin has a biphenyl structure represented by Formula (1A) or Formula (2A). Accordingly, a glass transition temperature (Tg) of the cured material of the resin composition can be improved, and the weight reduction rate of the cured material of the resin composition can be decreased. As a result, it is possible to establish both the high Tg and low weight reduction rate while maintaining characteristics such as adhesiveness, electrical stability, and flame retardancy of the cured material of the resin composition. Moreover, if the above constitution is adopted, the obtained resin composition exhibits excellent moldability. In addition, if the phenol resin curing agent or the epoxy resin has the biphenyl structure, the obtained resin composition exhibits excellent flame retardancy. Consequently, it is possible to obtain a resin composition exhibiting flame retardant without using a metal hydroxide-based flame retardancy which is likely to release water at a high temperature equal to or higher than 200° C. and to increase the weight reduction rate.

BRIEF DESCRIPTION OF THE DRAWINGS

The aforementioned object, other objects, characteristics, and advantages are further clarified by preferred embodiments and accompanying drawings described below.

FIG. 1 is a vertical cross-sectional view showing an example case in which an electronic device using the resin composition of the present invention is applied to a semiconductor device.

DESCRIPTION OF EMBODIMENTS

Hereinafter, the resin composition and the electronic device of the present invention will be described in detail based on embodiments.

First, the electronic device of the present invention will be described. In the following section, a case in which an electronic device using the resin composition of the present invention (electronic device of the present invention) Is applied to a semiconductor device will be described. The semiconductor package described below is an example, and examples of preferable embodiments of a semiconductor chip include semiconductor chips using silicon carbide (SiC) and gallium nitride (GaN).

(Semiconductor Device)

FIG. 1 is a vertical cross-sectional view showing an example case in which an electronic device using the resin composition of the present invention is applied to a semiconductor device. That is, in the following description, the upper side of FIG. 1 is described as "top", and the lower side thereof is described as "bottom".

A semiconductor device 10 shown in FIG. 1 is a Quad Flat Package (QFP)-type semiconductor package, and has a semiconductor chip (semiconductor element) 20 as an electronic component, a die pad 30 that supports the semiconductor chip 20 through an adhesive layer 60, a lead 40 that is electrically connected to the semiconductor chip 20, and a mold portion (encapsulating portion) 50 that encapsulates the semiconductor chip 20.

Examples of the semiconductor chip 20 include semiconductor chips using silicon carbide (SiC) or gallium nitride (GaN). The die pad 30 is constituted with a metallic substrate and functions as a support supporting the semiconductor chip 20. The die pad 30 may be, for example, a metallic substrate that is constituted with Cu, Fe, Ni, or an alloy of these (for example, a Cu-based alloy or an iron-nickel-based alloy such as Fe-42Ni), a substrate obtained by plating the surface of the metallic substrate with silver or Ni—Pd, or a substrate in which a gold plating (gold flashing) layer for improving stability of the Pd layer is disposed on the Ni—Pd-plated surface.

When seen in a plan view, the shape of the die pad 30 corresponds to the shape of the semiconductor chip 20, and is, for example, a quadrangular shape such as a square or a rectangle. In the outer periphery of the die pad 30, plural leads 40 are disposed radially.

The end of the lead 40 that is at the side opposite to the die pad 30 protrudes (exposed) from a mold portion 50. The lead 40 is constituted with a conductive material. For example, the lead 40 can be constituted with the same material as being used for the die pad 30.

The surface of the lead 40 may be plated with tin, and by doing this, when the semiconductor device 10 is connected to a terminal of a mother board by solder, adhesiveness between the solder and the lead 40 can be improved.

The semiconductor chip 20 is bonded (fixed) to the die pad 30 through the adhesive layer 60. The adhesive layer 60 is not particularly limited, and is formed of, for example, an epoxy-based adhesive, an acrylic adhesive, a polyamide-based adhesive, and a cyanate-based adhesive.

The semiconductor chip 20 has an electrode pad 21. The electrode pad 21 and the lead 40 are electrically connected to each other through a wire 22. In this manner, the semiconductor chip 20 and each lead 40 are electrically connected to each other. The material constituting the wire 22 is not particularly limited, and examples thereof include an Au wire, an Al wire, a Cu wire, and an Ag wire.

The die pad 30, the respective members disposed on the top surface of the die pad 30, and the internal part of the lead 40 are encapsulated with the mold portion 50. Therefore, the external end of the lead 40 protrudes from the mold portion 50.

The mold portion 50 is constituted with a cured material of the resin composition of the present invention. For example, the mold portion 50 is formed in a manner in which the respective members described above are encapsulated with the resin composition of the present invention by using a molding method such as transfer molding, and then the resin composition is completely cured for about 10 minutes to 10 hours at a temperature of about 80° C. to 200° C.

If the semiconductor chip 20 formed of silicon carbide (SiC) or gallium nitride (GaN) is used, as described in the section of "BACKGROUND ART", the mold portion 50 is required to exhibit excellent adhesiveness, electric stability, flame retardancy, moldability, and heat resistance (particularly, regarding the heat resistance, compatibility between increase of Tg and decrease of weight reduction.

Hereinafter, the resin composition of the present invention will be described (Resin Composition)

The resin composition of the present invention contains a phenol resin curing agent and an epoxy resin, in which the phenol resin curing agent is a phenol resin curing agent represented by Formula (1A), or the epoxy resin is an epoxy resin represented by Formula (2A).

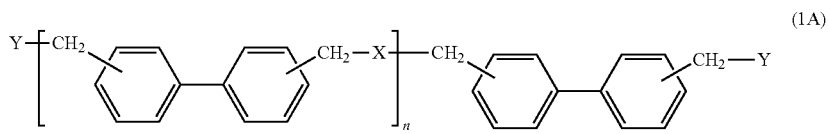

(In Formula (1A), each of two Ys independently represents a hydroxyphenyl group represented by Formula (1B) or Formula (1C); X represents a hydroxyphenylene group represented by Formula (1D) or Formula (1E); n represents a number equal to or greater than 0; and when n is equal to or greater than 2, each of two or more Xs may be independently the same as or different from each other.)

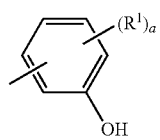

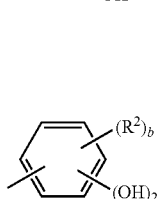

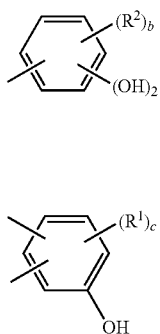

(In Formulae (1B) to (1E), each of $R^1$ and $R^2$ independently represents a hydrocarbon group having 1 to 5 carbon atoms; a represents an integer of 0 to 4; b represents an integer of 0 to 3; c represents an integer of 0 to 3; and d represents an integer of 0 to 2.)

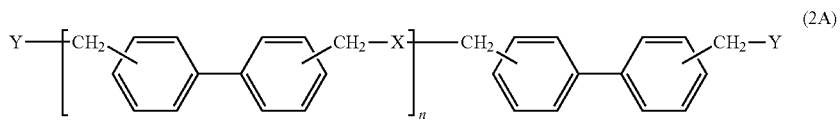

(In Formula (2A), each of two Ys independently represents a glycidylated phenyl group represented by Formula (28) or Formula (2C); X represents a glycidylated phenylene group represented by Formula (2D) or Formula (2E); n represents a number equal to or greater than 0; and when n is equal to or greater than 2, each of two or more Xs may be independently the same as or different from each other.)

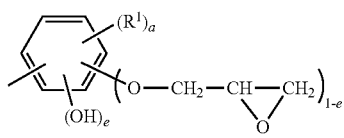

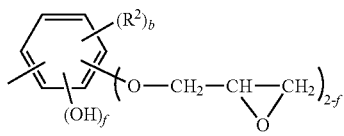

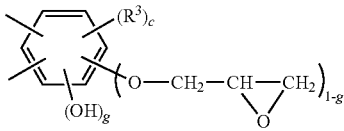

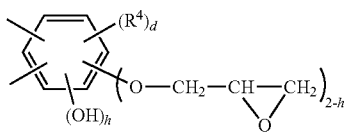

(In Formulae (2B) to (2E), each of $R^1$, $R^2$, $R^3$, and $R^4$ independently represents a hydrocarbon group having 1 to 5 carbon atoms; a represents an integer of 0 to 4; b represents an integer of 0 to 3; c represents an integer of 0 to 3; d represents an integer of 0 to 2; and each of e and g independently represents an integer of 0 or 1; and each of f and h independently represents an integer of 0 to 2.)

Hereinafter, the respective components contained in the resin composition will be described.

(Phenol Resin Curing Agent)

In an embodiment of the present invention, the phenol resin curing agent used for the resin composition of the present invention is a polymer represented by Formula (1A). In the present specification, the "polymer" includes compounds represented by Formula (1A) and Formula (1B) in which n=0.

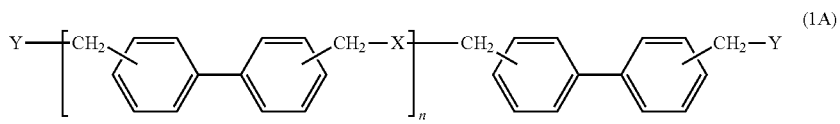

(In Formula (1A), each of two Ys independently represents a hydroxyphenyl group represented by Formula (1B) or Formula (1C); X represents a hydroxyphenylene group represented by Formula (1D) or Formula (1E); n represents a number equal to or greater than 0; and when n is equal to or greater than 2, each of two or more Xs may be independently the same as or different from each other.)

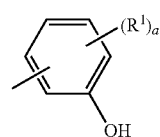

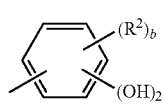

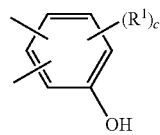

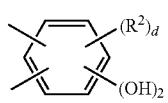

(In Formulae (1B) to (1E), each of $R^1$ and $R^2$ independently represents a hydrocarbon group having 1 to 5 carbon atoms; a represents an integer of 0 to 4; b represents an integer of 0 to 3; c represents an integer of 0 to 3; and d represents an integer of 0 to 2.)

In the phenol resin curing agent represented by Formula (1A), n is an average and is preferably 0 to 6, more preferably 0 to 3, and even more preferably 0 to 1. A number average molecular weight of the phenol resin curing agent represented by Formula (1A) is preferably equal to or more than 390 and equal to or less than 1,000, more preferably equal to or more than 400 and equal to or less than 600, even more preferably equal to or more than 400 and equal to or less than 550, and particularly preferably equal to or more than 400 and equal to or less than 500. The phenol resin curing agent has an aromatic ring substituted with plural hydroxyl groups. Accordingly, in the phenol resin curing agent, intermolecular interaction derived from hydrogen bonds is strong. Moreover, regarding moldability, particularly, filling properties obtained during continuous molding, the phenol resin curing agent sometimes shows unique behavior different from the behavior of the resin in the related art that results from the concept of fluidity or curability that is defined in the related art. If the phenol resin curing agent of which the number average molecular weight is within the above range is used, a resin composition having excellent curability and continuous moldability is obtained, and the cured material thereof has a high glass transition temperature and a low weight reduction rate. The value of n can be calculated from the number average molecular weight, X and Y described above, and the structure of a biphenyl skeleton and a ratio of components thereof.

In the phenol resin curing agent represented by Formula (1A), each of $R^1$, and $R^2$ in Formulae (1B) to (1E) independently represents a hydrocarbon group having 1 to 5 carbon atoms. If the number of carbon atoms is equal to or less than 5, reactivity of the obtained resin composition is lowered, whereby deterioration of moldability can be reliably prevented.

Specifically, examples of the substituents $R^1$ and $R^2$ include alkyl groups such as a methyl group, an ethyl group, a propyl group, an n-butyl group, an isobutyl group, a t-butyl group, an n-pentyl group, a 2-methylbutyl group, a 3-methylbutyl group, and a t-pentyl group, and among these, a methyl group is preferable. If a methyl group is used as the substituent, balance between curability and hydrophobicity of the resin composition can be particularly excellent.

a and c in Formula (1B) and Formula (1D) represent the number of substituent $R^1$ bonded to the same benzene ring. Each a is independently an integer of 0 to 4, and each c is independently an integer of 0 to 3. b and d in Formula (1C) and Formula (1E) represent the number of substituent $R^2$ bonded to the same benzene ring. Each b is independently an integer of 0 to 3, and each d is independently an integer of 0 to 2. a, b, c, and d are preferably an integer of 0 or 1.

According to an embodiment of the present invention, the phenol resin curing agent represented by Formula (1A) contains a monovalent hydroxyphenyl group represented by Formula (1B), a monovalent hydroxyphenylene group represented by Formula (1D), a divalent hydroxyphenyl group represented by Formula (1C), and a divalent hydroxyphenylene represented by Formula (1E).

If the phenol resin curing agent containing the monovalent hydroxyphenyl group represented by Formula (1B) and the monovalent hydroxyphenylene group represented by Formula (1D) is used, the obtained resin composition exhibits excellent flame retardancy, a low water absorption rate, and soldering resistance.

In the phenol resin curing agent containing the divalent hydroxyphenyl group represented by Formula (1C) and the divalent hydroxyphenylene group represented by Formula (1E), density of phenolic hydroxyl groups is high. Accordingly, the cured material of the obtained resin composition has a high glass transition temperature (Tg). Generally, in the polymer having phenolic hydroxyl groups, such as the phenol resin curing agent represented by Formula (1A), the higher the density of the phenolic hydroxyl groups is, the higher the weight reduction rate thereof becomes. However, in a crosslinked substance consisting of the phenol resin curing agent represented by Formula (1A) and an epoxy resin, increase of the weight reduction rate resulting from increase of Tg is suppressed. The following is considered to be the reason, though it is not a definite reason. That is, the portion of methylene group that connects the biphenyl skeleton to the divalent phenol in the crosslinked substance may be protected by steric bulkiness, and accordingly, the resin composition may undergo thermal decomposition relatively to a smaller extent.

In the phenol resin curing agent represented by Formula (1A), provided that the sum of the number of the hydroxyphenyl group represented by Formula (1B) and the number of the hydroxyphenylene group represented by Formula (1D) is k, the average of k is k0, the sum of the number of hydroxyphenyl group represented by Formula (1C) and the number of the hydroxyphenylene group represented by Formula (1E) is m, and the average of m is m0, the value of k0/m0 is preferably 0/100 to 82/18, more preferably 20/80 to 80/20, and even more preferably 25/75 to 75/25. If the value of k0/m0 is within the above range, it is possible to economically obtain a resin composition in which the fluidity, soldering resistance, flame retardancy, continuous moldability, and heat resistance are excellently balanced.

The value of k0 and m0 can be obtained by arithmetical calculation by regarding a relative intensity ratio measured by Field Desorption Mass Spectrometry (FD-MS) as a mass ratio. Alternatively, the value of k0 and m0 can be obtained by H-NMR spectroscopy or C-NMR spectroscopy.

In an embodiment of the present invention, in addition to or instead of the phenol resin represented by Formula (1A), it is possible to use novolac-type resins such as phenol novolac resins, cresol novolac resins, and naphthol novolac resins; polyfunctional phenol resins such as triphenolmethane-type phenol resins; modified phenol resins such as terpene-modified phenol resins and dicyclopentadiene-modified phenol resins; aralkyl-type resins such as phenol aralkyl resins having a phenylene skeleton and/or a biphenylene skeleton and naphthol aralkyl resins having a phenylene and/or biphenylene skeleton; bisphenol compounds such as bisphenol A and bisphenol F; and the like.

In an embodiment of the present invention, in addition to the above phenol resin, polyaddition-type curing agents, catalyst-type curing agents, condensation-type curing agents, and the like can be used.

Examples of the polyaddition-type curing agents include aliphatic polyamine such as diethylenetriamine, triethylenetetramine, and m-xylenediamine; aromatic polyamine such as diaminodiphenylmethane, m-phenylenediamine, and diaminodiphenylsulfone; polyamine compounds such as dicyan diamide and organic acid dihydrazide; alicyclic acid anhydrides such as hexahydrophthalic anhydride and methyl tetrahydrophthalic anhydride; acid anhydrides including aromatic acid anhydrides such as trimellitic anhydride, pyromellitic anhydride, and benzophenone tetracarboxylic acid; phenol resin curing agents such as phenol resins, and phenol polymers represented by polyvinyl phenol; polymercaptan compounds such as polysulfide, thioester, and thioether; isocyanate compounds such as isocyanate prepolymers and blocked isocyanate; organic acids such as carboxylic acid-containing polyester resins; and the like.

Examples of the catalyst-type curing agents include tertiary amine compounds such as benzyldimethylamine, and 2,4,6-trisdimethylaminomethylphenol; imidazole compounds such as 2-methylimidazole and 2-ethyl-4-methylimidazole; Lewis acids such as a $BF_3$ complex; and the like.

Examples of the condensation-type curing agents include phenol resin curing agents such as resol-type phenol resins; urea resins such as methylol group-containing urea resins; melamine resins such as methylol group-containing melamine resins; and the like.

Among these, in view of balance among flame retardancy, moisture resistance, electric characteristics, curability, storage stability, and the like, phenol resin curing agents are preferable.

(Method for Producing Phenol Resin Curing Agent)

The phenol resin curing agent represented by Formula (1A) can be produced by the following method.

The phenol resin curing agent represented by Formula (1A) can be produced by, for example, causing a reaction among a biphenylene compound represented by Formula (3), a monovalent phenol compound represented by Formula (4), and a divalent phenol compound represented by Formula (5) in the presence of an acidic catalyst.

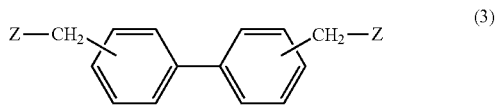

(In Formula (3), Z represents a hydroxyl group, a halogen atom, or an alkoxy group having 1 to 6 carbon atoms.)

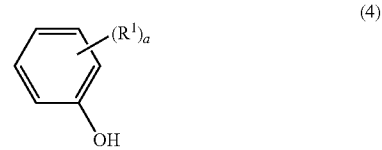

(In Formula (4), $R^1$ represents a hydrocarbon group having 1 to 5 carbon atoms; and a represents an integer of 0 to 4.)

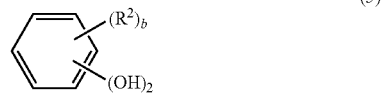

(In Formula (5), $R^2$ represents a hydrocarbon group having 1 to 5 carbon atoms; and b represents an integer of 0 to 3.)

Examples of the halogen atom represented by Z of the compound represented by Formula (3) include a fluorine atom, a chorine atom, a bromine atom, an iodine atom, and the like. Examples of the alkoxy group having 1 to 6 carbon atoms include a methoxy group, an ethoxy group, a propoxy group, an n-butoxy group, an isobutoxy group, a t-butoxy group, an n-pentoxy group, a 2-methylbutoxy group, a 3-methylbutoxy group, a t-pentoxy group, an n-hexyloxy group, a 1-methylpentoxy group, a 2-methylpentoxy group, a 3-methylpentoxy group, a 4-methylpentoxy group, a 2,2-dimethylbutoxy group, a 2,3-dimethylbutoxy group, a 2,4-dimethylbutoxy group, a 3,3-dimethylbutoxy group, a 3,4-dimethylbutoxy group, a 4,4-dimethylbutoxy group, a 2-ethylbutoxy group, a 1-ethylbutoxy group, and the like.

Specific examples of the compound represented by Formula (3) include 4,4'-bischloromethylbiphenyl, 4,4'-bisbromometbylbiphenyl, 4,4'-bisiodomethylbiphenyl, 4,4'-bishydroxymethylbiphenyl, 4,4'-bismethoxymethylbiphenyl, and the like. One kind of these compounds can be used singly, or two or more kinds thereof can be used in combination. Among the compounds, it is preferable to use 4,4'-bismethoxymethylbiphenyl or 4,4'-bischloromethylbiphenyl, 4,4'-Bismethoxymethylbiphenyl is preferably used, since this compound can be synthesized at a relatively low temperature and makes it easy to distill away or handle byproducts of reaction. 4,4'-Bischloromethylbiphenyl is preferably used, since this compound makes it possible to use a hydrogen halide, which is generated by a trace of moisture, as an acid catalyst.

Examples of the monovalent phenol compound represented by Formula (4) include phenol, o-cresol, p-cresol, m-cresol, phenylphenol, ethylphenol, n-propylphenol, isopropylphenol, t-butylphenol, xylenol, methylpropylphenol, methylbutylphenol, dipropylphenol, dibutylphenol, nonylphenol, mesitol, 2,3,5-trimethylphenol, 2,3,6-trimethylphenol, and the like. One kind of these compounds may be used singly, or two or more kinds thereof may be used concurrently. Among these, phenol and o-cresol are preferable. Particularly, phenol is more preferably used since it exhibits excellent reactivity with respect to an epoxy resin.

Examples of the divalent phenol compound represented by Formula (5) include resorcinol, catechol, hydroquinone, and the like. One kind of these compounds may be used singly, or two or more kinds thereof may be used concurrently. Among these, resorcinol and hydroquinone are preferably used from the viewpoint of the reactivity of the resin composition. Particularly, resorcinol is more preferably used since this compound makes it possible to synthesize the phenol resin curing agent at a relatively low temperature.

The acidic catalyst is not particularly limited, and examples thereof include formic acid, oxalic acid, p-toluenesulfonic acid, hydrochloric acid, sulfuric acid, phosphoric acid, acetic acid, trifluoromethanesulfonic acid, Lewis acid, and the like. One kind of these catalysts can be used singly, or two or more kinds thereof can be used in combination.

When the group Z in the compound represented by Formula (3) is a halogen atom, a hydrogen halide produced as a byproduct by the reaction acts as an acidic catalyst. Therefore, an acidic catalyst does not need to be used, whereby the reaction can be rapidly started by adding a small amount of water.

In the aforementioned method for producing the phenol resin curing agent, the reaction conditions can be adjusted such that a number average molecular weight of the obtained phenol resin curing agent becomes preferably equal to or more than 390 and equal to or less than 1,000, more preferably equal to or more than 400 equal to or less than 600, even more preferably equal to or more than 400 and equal to or less than 550, and particularly preferably equal to or more than 400 equal to or less than 500. For example, a total of 1 mole of the monovalent phenol compound and the divalent phenol compound are reacted with 0.01 mol to 0.8 mol of a biphenylene compound and optionally with 0.01 mol to 0.05 mol of an acidic catalyst. Thereafter, while the generated gas and moisture are being discharged out of the system by using a nitrogen flow, the reactants are reacted at 80° C. to 170° C. for 1 to 20 hours. Subsequently, unreacted monomers (for example, benzyl compounds or dihydroxynaphthalene compounds) remaining after the reaction ends, byproducts of the reaction (for example, a hydrogen halide and methanol), and the catalyst are distilled away by methods such as distillation under reduced pressure and steam distillation, whereby a phenol resin curing agent having a desired number average molecular weight can be obtained.

In the aforementioned method for producing the phenol resin curing agent, the reaction conditions can be adjusted, such that a mixing ratio (k0/m0) between the monovalent phenol compound of Formula (18) and the divalent phenol compound of Formula (1D) contained in the obtained phenol resin curing agent becomes preferably 0/100 to 82/18, more preferably 20/80 to 80/20, and even more preferably 25/75 to 75/25. For example, based on a total of 100 mol % of the monovalent phenol compound and the divalent phenol compound, the monovalent phenol compound can be reacted preferably in an amount of 15 mol % to 85 mol %, more preferably in an amount of 20 mol % to 80 mol %, and even more preferably in an amount of 20 mol % to 75 mol %. If the proportion of the monovalent phenol compound mixed in is equal to or higher than the above lower limit, increase in the raw material cost can be suppressed, and a resin composition exhibiting excellent fluidity can be obtained. If the proportion of the monovalent phenol compound mixed in is equal to or lower than the above upper limit, the obtained resin composition exhibits excellent heat resistance and sufficient hardness at a molding temperature, and accordingly, the resin composition can exhibit excellent moldability. If the proportion of the monovalent phenol compound mixed in is equal to or lower than the above lower limit, increase in raw material cost can be suppressed. As a result, the obtained resin composition exhibits excellent fluidity, soldering resistance, and flame retardancy and shows sufficient toughness at a molding temperature, and accordingly, moldability thereof can become excellent. If the mixing ratio between two kinds of the phenol compounds is within the range described above, a resin composition in which fluidity, soldering resistance, flame retardancy, and heat resistance, particularly, continuous moldability are excellently balanced can be obtained economically.

The number average molecular weight, hydroxyl equivalent, and value of k0/m0 of the phenol resin curing agent represented by Formula (1A) can be adjusted using a phenol resin synthesis method known to those skilled in the art. For example, the value of k0/m0 of the phenol resin curing agent can be adjusted by the mixing ratio between the monovalent phenol compound and the divalent phenol compound used for the synthesis. More specifically, by a method in which the amount of the biphenylene compound with respect to the total amount of the monovalent phenol compound and the divalent phenol compound used for synthesizing the phenol resin curing agent is set to be approximately 1:1 in terms of a molar ratio, a phenol resin curing agent having a high molecular weight and high viscosity can be obtained. Meanwhile, by methods such as a method of decreasing the molar ratio of the biphenylene compound to the total amount of the monovalent phenol compound and the divalent phenol compound used for synthesizing the phenol resin curing agent, a method of decreasing the amount of the acid catalyst to be mixed in, a method of rapidly discharging hydrogen halide gas out of the system by using a nitrogen gas flow if such gas is generated, and a method of decreasing the reaction temperature, the amount of generated high-molecular weight components is reduced, whereby a phenol resin curing agent having a number average molecular weight that is within the preferable range described above can be obtained. In this case, the way the reaction proceeds can be checked, by observing the state of gas of a hydrogen halide or an alcohol that is produced as a byproduct by the reaction among the biphenylene compound of Formula (3), the monovalent phenol compound of Formula (4), and the divalent phenol compound of Formula (5), or by measuring the molecular weight of the products produced during the react ion by means of gel permeation chromatography.

In an embodiment of the present invention, the amount of the phenol resin curing agent in the resin composition is preferably equal to or more than 1% by mass and equal to or less than 20% by mass, more preferably equal to or more than 2% by mass and equal to or less than 15% by mass, and even more preferably equal to or more than 3% by mass and equal to or less than 10% by mass, with respect to the entire resin composition. If the phenol resin curing agent is used within the above range, a resin composition in which excellent curability, heat resistance, and soldering resistance are well balanced is obtained.

When the phenol resin curing agent represented by Formula (1A) is used as a phenol resin curing agent, the amount of the phenol resin curing agent is preferably equal to or more than 50% by mass with respect to the all curing agents used. If the phenol resin curing agent represented by Formula (1A) is used in such an amount, the performance thereof can be reliably exhibited.

(Epoxy Resin)

In an embodiment of the present invention, the epoxy resin used for the resin composition of the present invention is a polymer represented by Formula (2A).

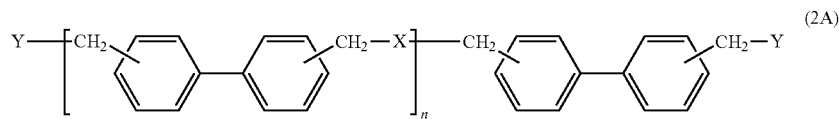

(2A)

(In Formula (2A), each of two Ys independently represents a glycidylated phenyl group represented by Formula (2B) or Formula (2C); X represents a glycidylated phenylene group represented by Formula (2D) or Formula (2E); n represents a number equal to or greater than 0; and when n is equal to or greater than 2, each of two or more Xs may be independently the same as or different from each other.)

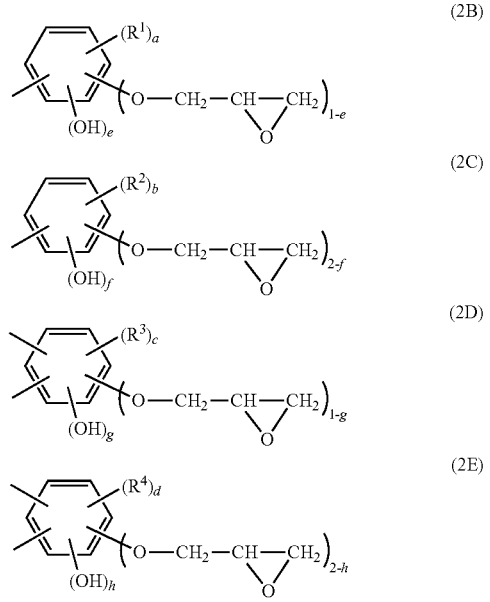

(In Formulae (2B) to (2E), each of $R^1$, $R^2$, $R^3$, and $R^4$ independently represents a hydrocarbon group having 1 to 5 carbon atoms; a represents an integer of 0 to 4; b represents an integer of 0 to 3; c represents an integer of 0 to 3; d represents an integer of 0 to 2; and each of e and g independently represents an integer of 0 or 1; and each of f and h independently represents an integer of 0 to 2.)

In the epoxy resin represented by Formula (2A), n is an average which is preferably 0 to 6, more preferably 0 to 3, and even more preferably 0 to 1. A number average molecular weight of the epoxy resin represented by Formula (2A) is preferably equal to or more than 450 equal to or less than 2,000, more preferably equal to or more than 500 and equal to or less than 1,000, even more preferably equal to or more than 500 and equal to or less than 800, and most preferably equal to or more than 500 and equal to or less than 700. In the process of curing, such an epoxy resin is greatly influenced by the interaction between hydrogen bonds derived from the phenol resin curing agent containing an aromatic ring having plural hydroxyl groups. Therefore, regarding moldability, particularly, filling properties obtained during continuous molding, the epoxy resin sometimes shows unique behavior different from the behavior of the resin in the related art that results from the concept of fluidity or curability that is defined in the related art. If the epoxy resin having a number average molecular weight within the above range is used, a resin composition exhibiting excellent curability and continuous moldability is obtained, and the cured material thereof has a high glass transition temperature and a low weight reduction rate. n can be calculated from the number average molecular weight, X and Y described above, and the structure of a biphenyl skeleton and a ratio of components thereof.

In the epoxy resin represented by Formula (2A), each of $R^1$, $R^2$, $R^3$, and $R^4$ in Formulae (2B) to (2E), independently represents a hydrocarbon group having 1 to 5 carbon atoms. If the number of carbon atoms is equal to or less than 5, reactivity of the obtained resin composition is lowered, whereby deterioration of moldability can be reliably prevented.

Specific examples of the substituents $R^1$, $R^2$, $R^3$, and $R^4$ include a methyl group, an ethyl group, a propyl group, an n-butyl group, an isobutyl group, a t-butyl group, an n-pentyl group, a 2-methylbutyl group, a 3-mothylbutyl group, a t-pentyl group, and the like. Among these, a methyl group is preferable. If a methyl group is used, balance between curability and hydrophobicity of the resin composition can be particularly excellent.

a and c in Formulae (2B) and (2D) represent the number of substituent $R^1$ or $R^3$ bonded to the same benzene ring. Each a independently is an integer of 0 to 4, and each c independently is an integer of 0 to 3. b and d in Formula (2C) and Formula (2E) represent the number of substituent $R^2$ or $R^4$ bonded to the same benzene ring. Each b independently is an integer of 0 to 3, and each d independently is an integer of 0 to 2. a, b, c, and d are preferably an integer of 0 or 1.

e and g in Formula (2B) and Formula (2D) represent the number of hydroxyl group bonded to the same benzene ring, and (1-e) and (1-g) in Formula (2B) and Formula (2D) represents the number of glycidyl ether group bonded to the same benzene ring. Each of e and g independently represents an integer of 0 or 1. Therefore, in Formula (2B) and Formula (2D), one hydroxyl group or one glycidyl ether group is bonded to the same benzene ring. f and h in Formula (2C) and Formula (2E) represents the number of hydroxyl group bonded to the same benzene ring, and (2-f) and (2-h) in Formula (2C) and Formula (2E) represents the number of glycidyl ether group bonded to the same benzene ring. Each of f and h independently represents an integer equal to or greater than 0 and equal to or less than 2. Therefore, in Formula (2C) and Formula (2E), when a hydroxyl group is not bonded to the same benzene ring, two glycidyl ether groups are bonded to the same benzene ring. Alternatively, when one hydroxyl group is bonded to the same benzene ring, one glycidyl ether group is bonded to the benzene ring, or when two hydroxyl groups are bonded to the same benzene ring, a glycidyl group is not bonded to the ring. In this way, in the polymer (epoxy resin) represented by Formula (2A), not all the functional groups bonded to the benzene ring are glycidyl ether groups, and hydroxyl groups are partially connected to (remains in) the benzene ring, in addition to the glycidyl ether groups.

In an embodiment of the present invention, regarding the epoxy group represented by Formula (2A), provided that a total number of glycidyl ether group contained in the epoxy resin is M, and a total number of hydroxyl group contained in the epoxy group is N, a value of M/(M+N) is preferably equal to or greater than 0.50 and equal to or less than 0.97, more preferably equal to or greater than 0.70 and equal to or less than 0.97, and even more preferably equal to or greater than 0.85 and equal to or less than 0.97. Provided that an ideal epoxy equivalent, which is obtained when a glycidyl group is added to a hydroxyl equivalent of a phenol resin as a raw material of the epoxy resin, is EPC, and an actually measured epoxy equivalent is EPA, if a value of EPC/EPA is calculated, the value of M/(M+N) can be determined.

The epoxy resin having the value of M/(M+N) within the above range exhibits appropriate compatibility with respect to the release agent used for the resin composition. Therefore, when the cured material (mold portion 50) of the obtained resin composition is continuously molded using a mold (molding die), it is possible to reliably inhibit or prevent contamination of the mold and clogging of air vents caused by residual burrs. Consequently, it is possible to reduce contamination of the mold and to decrease the portion not filled with the cured material. As a result, the resin composition containing such an epoxy resin exhibits excellent continuous moldability of the cured material thereof obtained after the molding.

According to an embodiment of the present invention, the epoxy resin represented by Formula (2A) contains a glycidylated phenyl group that is represented by Formula (2B) and has one glycidyl ether group, a glycidylated phenylene group that is represented by Formula (2D) and has one glycidyl ether group, a glycidylated phenyl group that is represented by Formula (2C) and has two glycidyl ether groups, and a glycidylated phenylene group that is represented by Formula (2E) and has two glycidyl ether groups.

If the epoxy resin, which contains the glycidylated phenyl group that is represented by Formula (2B) and has one glycidyl ether group and the glycidylated phenylene group that is represented by Formula (2D) and has one glycidyl ether group, is used, the obtained resin composition exhibits excellent flame retardancy, a low water absorption rate, and soldering resistance.

In the epoxy resin, which contains the glycidylated phenyl group that is represented by Formula (2C) and has two glycidyl ether groups and the glycidylated phenylene group that is represented by Formula (2E) and has two glycidyl ether groups, density of the glycidyl ether groups is high. Accordingly, a cured material of the obtained resin composition has a high glass transition temperature (Tg). Generally, in the epoxy resin represented by Formula (2A), the higher the density of the glycidyl ether groups is, the higher the weight reduction rate becomes. However, in a crosslinked substances consisting of the epoxy resin represented by Formula (2A) and the aforementioned phenol resin curing agent, increase of the weight reduction rate resulting from increase of Tg is suppressed. The following is considered to be the reason, though it is not a definite reason. That is, the portion of methylene group that connects the biphenyl skeleton to the monovalent or divalent phenol in the crosslinked substance may be protected by steric bulkiness, and accordingly, the resin composition may undergo thermal decomposition relatively to a smaller extent.

In an embodiment of the present invention, in addition to or instead of the epoxy resin represented by Formula (2A), for example, it is possible to use crystalline epoxy resins such as biphenyl-type epoxy resins, bisphenol-type epoxy resins, stilbene-type epoxy resins, sulfide-type epoxy resins, and dihydroxyanthracene-type epoxy resins; novolac-type epoxy resins such as methoxynaphthalene skeleton-containing novolac-type epoxy resins, phenol novolac-type epoxy resins, and cresol novolac-type epoxy resins; phenol-modified aromatic hydrocarbon-formaldehyde resin-type epoxy resins that are obtained by modifying a resin, which is obtained by causing condensation between aromatic hydrocarbon and formaldehyde, with phenol and epoxylating the resin; polyfunctional epoxy resins such as triphenolmethane-type epoxy resins, alkyl-modified triphenolmethane-type epoxy resins, and tetrakishydroxyphenylethane-type epoxy resins; aralkyl-type epoxy resins such as phenol aralkyl-type epoxy resins having a phenylene skeleton and phenol aralkyl-type epoxy resins having a biphenylene skeleton; naphthol-type epoxy resins such as dihydroxynaphthalene-type epoxy resins and epoxy resins that are obtained by glycidyl etherifying a dimer of dihydroxynaphthalene; triazine core-containing epoxy resins such as triglycidyl isocyanurate and monoallyl diglycidyl isocyanurate; bridged cyclic hydrocarbon compound-modified phenol-type epoxy resins such as dicyclopentadiene-modified phenol-type epoxy resins; and phenolphthalein-type epoxy resins obtained by causing a reaction between phenolphthalein and epichlorohydrin. One kind of these epoxy resins can be used singly, or two or more kinds thereof can be used in combination.

Among these epoxy resins, in view of excellent fluidity, the crystalline epoxy resins are preferable. The polyfunctional epoxy resins are preferable, since these exhibit excellent high temperature storage life (HTSL). The phenolphthalein-type epoxy resins are preferable, since these exhibit an excellent balance among flame retardancy, high temperature storage life (HTSL), and soldering resistance even when the content of an inorganic filler which will be described later is small. The epoxy resins like aralkyl-type epoxy resins such as phenol aralkyl-type epoxy resins having a phenylene skeleton, the phenol aralkyl-typo epoxy resins having a biphenylene skeleton, and the phenol-modified aromatic hydrocarbon-formaldehyde resin-type epoxy resins are preferable, since these exhibit excellent soldering resistance. The epoxy resins having a naphthalene skeleton in a molecule, such as the naphthol-type epoxy resins and the methoxynaphthalene skeleton-containing novolac-type epoxy resins, are preferable, since these exhibit excellent balance between flame retardancy and high temperature storage life (HTSL).

(Method for Producing Epoxy Resin)

The epoxy resin represented by Formula (2A) can be produced by the following method.

The epoxy resin represented by Formula (2A) can be produced by for example, causing a reaction between the phenol resin curing agent represented by Formula (1A) and epichlorohydrin so as to substitute hydroxyl groups of the phenol resin curing agent with glycidyl ether groups. At this time, as the phenol resin curing agent represented by Formula (1A)

that is used as a raw material, compounds that are in the form of preferable curing agents can be selected and used. If a portion of the hydroxyl groups are caused to remain in a state of not being substituted with glycidyl ether groups, an epoxy resin represented by Formula (2A) that has a desired value of M/(M+N) can be obtained.

More specifically, the phenol resin curing agent represented by Formula (1A) is mixed with epichlorohydrin in an excess amount. Thereafter, in the presence of an alkali metal hydroxide such as sodium hydroxide and potassium hydroxide, the mixture is reacted preferably at 50° C. to 150° C. and more preferably at 60° C. to 120° C., preferably for about 1 to 10 hours. Subsequently, after the reaction ends, the epichlorohydrin in an excess amount is removed by distillation, the residues are dissolved in an organic solvent such as methyl isobutyl ketone, filtered, and washed with water to remove inorganic salts, and then the organic solvent is distilled away, thereby obtaining the epoxy resin.

The amount of epichlorohydrin added is preferably set such that the amount preferably becomes about 2-fold moles to 15-fold moles and more preferably becomes about 2-fold moles to 10-fold moles with respect to the hydroxyl equivalent of the phenol resin curing agent as a raw material. The amount of the alkali metal hydroxide added is set such that the amount preferably becomes about 0.8-fold moles to 1.2-fold moles and more preferably becomes about 0.9-fold moles to 1.1-fold moles with respect to the hydroxyl equivalent of the phenol resin curing agent.

As a method of substituting a portion of hydroxyl groups, which are contained in the phenol resin curing agent represented by Formula (1A), with glycidyl ether groups, I: reducing the amount of epichlorohydrin added, compared to the usual case, II: reducing the amount of frequency factors of epichlorohydrin and the phenol resin curing agent by using a solvent, III: setting the reaction time to be short, IV: decreasing the reaction temperature, and the like can be preferably used. However, the method is not limited to the above.

If the reaction conditions are adjusted, it is possible to make a portion of hydroxyl groups, which are contained in the phenol resin curing agent represented by Formula (1A), remain without being substituted with glycidyl ether groups, and as a result, the epoxy resin represented by Formula (2A) can be reliably obtained.

In an embodiment of the present invention, the total amount of the epoxy resin in the resin composition is preferably equal to or more than 1% by mass and equal to or less than 20% by mass, more preferably equal to or more than 2% by mass and equal to or less than 15% by mass, and even more preferably equal to or more than 3% by mass and equal to or less than 10% by mass, with respect to the entire resin composition. If the epoxy resin is used within the above range, excellent curability, heat resistance, and soldering resistance are well balanced in the obtained resin composition.

When the epoxy resin represented by Formula (2A) is used as an epoxy resin, the amount of the epoxy resin is preferably equal to or more than 50% by mass with respect to the entire epoxy resin used. If the epoxy resin is used in such an amount, the epoxy resin represented by Formula (2A) can reliably exhibit the performance thereof.

From the viewpoint of moisture-resistance reliability, it is preferable for the resin composition not to contain Na ions or Cl ions as ionic impurities as much as possible. Moreover, from the viewpoint of curability of the resin composition, an epoxy equivalent of the epoxy resin is preferably equal to or more than 100 g/eq and equal to or less than 500 g/eq.

In an embodiment of the present invention, the resin composition contains, as main components, a polymer represented by Formula (1A) as a phenol resin curing agent and a polymer represented by Formula (2A) as an epoxy resin. The polymer represented by Formula (1A) contains at least one of the divalent hydroxyphenyl group represented by Formula (1C) and the divalent hydroxyphenylene group represented by Formula (1E). Moreover, the polymer represented by Formula (2A) contains at least one of the glycidylated phenyl group that is represented by Formula (2C) and has two glycidyl ether groups and the glycidylated phenylene group that is represented by Formula (2E) and has two glycidyl ether groups.

That is, in the polymer represented by Formula (1A), two hydroxyl groups are introduced into the phenyl groups constituting the main skeleton thereof. Moreover, in the polymer represented by Formula (2A), two glycidyl ether groups are introduced into the phenyl groups constituting the main skeleton thereof. Due to the above constitution, density of hydroxyl groups can be improved in the polymer represented by Formula (1A), and density of epoxy groups can be improved in the polymer represented by Formula (2A).

When the phenol resin curing agent is a polymer represented by Formula (1A), and the epoxy resin is a polymer represented by Formula (2A), density of functional groups of the both polymers is improved. Accordingly, crosslink density of the cured material, which is formed by crosslinking epoxy resin molecules through the phenol resin curing agent, is improved. As a result, a glass transition temperature (Tg) of the cured material increases.

In an embodiment of the present invention, when the phenol resin curing agent is a polymer represented by Formula (1A), and the epoxy resin is a polymer represented by Formula (2A), these polymers can have the same main skeleton. That is, in the polymer represented by Formula (1A), hydroxyl groups are introduced into phenyl groups constituting the main skeleton thereof, and in the polymer represented by Formula (2A), glycidyl ether groups are introduced into the phenyl groups constituting the main skeleton thereof; however, except for the above point, these polymers can be embodied such that they have the same structural unit. In other words, these polymers contain a structural unit having the same main skeleton.

Generally, when the density of functional groups is increased to increase a glass transition temperature (Tg) of a cured material of a resin composition, as a counter reaction with respect to the above, crosslinking points (linkage portions) formed by a reaction between an epoxy group (glycidyl ether group) and a hydroxyl group undergo thermal decomposition, whereby a weight reduction rate increases. However, in the aforementioned embodiment of the present invention, even when the density of functional groups is increased, the weight reduction resulting from thermal decomposition of the crosslinking points can be prevented or suppressed. Presumably, this is because the polymer represented by Formula (1A) and the polymer represented by Formula (2A) contain a structural unit having the same main skeleton. Moreover, presumably, this is because the methylene group present in the crosslinked substance consisting of the phenol resin curing agent and the epoxy resin is protected by steric bulkiness of these polymers as described above, whereby secondary decomposition is suppressed.

As described above, if the resin composition contains, as main components, the polymer represented by Formula (1A) as the phenol resin curing agent and the polymer represented by Formula (2A) as the epoxy resin, both the increase of Tg of the cured material of the resin composition and decrease of the weight reduction rate of the cured material can be realized. As a result, the cured material obtained by curing the resin composition can exhibit excellent adhesiveness, electric stability, flame retardancy, moldability, particularly, continuous moldability, and heat resistance. Particularly, regarding the heat resistance, increase of Tg and decrease of weight reduction can be compatible with each other.

Specifically, if the resin compositions constituted as above, Tg of the cured material thereof can be set to preferably equal to or higher than 180° C., more preferably equal to or higher than 200° C. and equal to or lower than 300° C., and even more preferably equal to or higher than 220° C. and equal to or lower than 250° C. Moreover, the weight production ratio thereof can be set to preferably equal to or lower than 0.3%, more preferably equal to or higher than 0.07% and equal to or lower than 0.25%, and even more preferably equal to or higher than 0.07% and equal to or lower than 0.2%. If the Tg and weight reduction rate of the cured material can be set within the above range, the resin-cured material does not easily deteriorate even at a high temperature. Accordingly, the resin composition can be used as a semiconductor encapsulating material of a package equipped with a semiconductor element such as SiC or GaN.

The weight reduction rate of the cured material can be measured by, for example, the following method. First, a discoid test piece made of the resin composition is formed, and the test piece is cured for 4 hours at 175° C. Thereafter, the test piece is dried for 20 hours at 125° C. and cooled. Subsequently, the weight thereof is measured, and the initial weight thereof is determined. Next, the test piece is put into a high-temperature bath of 200° C. in the atmosphere and heated for 1,000 hours, followed by cooling. Thereafter, the weight thereof is measured, and the weight of the test piece having undergone the above process is determined. By determining a ratio of the weight obtained after the process to the initial weight, the weight reduction rate can be calculated.

In an embodiment of the present invention, provided that a content of the phenol resin curing agent represented by Formula (1A) in the resin composition is A1 (% by mass), and a content of the epoxy resin represented by Formula (2A) in the resin composition is A2 (% by mass), the value of A1/(A1|A2) is preferably equal to or greater than 0.2 and equal to or less than 0.9, and more preferably equal to or greater than 0.3 and equal to or less than 0.7. If the value is within the above range, the number of crosslinking points formed of the glycidyl ether groups and the hydroxyl groups is adjusted within an appropriate range, whereby Tg of the cured material can be more reliably increased.

In an embodiment of the present invention, a lower limit of the hydroxyl equivalent of the phenol resin curing agent represented by Formula (1A) is set to preferably equal to or more than 90 g/eq, and more preferably equal to or more than 100 g/eq. Moreover, an upper limit of the hydroxyl equivalent is set to preferably equal to or less than 190 q/eq, more preferably equal to or less than 180 g/eq, and even more preferably equal to or less than 170 g/eq.

Moreover, in an embodiment of the present invention, upper and lower limits of the epoxy equivalent of the epoxy resin represented by Formula (2A) are preferably theoretical values that are yielded when the hydroxyl groups of the phenol resin curing agent represented by Formula (1A) are substituted with the glycidyl ether groups.

In an embodiment of the present invention, when the epoxy resin used has a hydroxyl group, that is, when a glycidyl ether group and a hydroxyl group are bonded to a benzene ring in the epoxy resin, the epoxy equivalent of such an epoxy resin is preferably equal to or more than 50% and more preferably equal to or more than 70% of the above theoretical value. If the epoxy equivalent is within the above range, the effects of the present invention can be exhibited, the epoxy resin exhibits appropriate compatibility with respect to the release agent, and the obtained resin composition exhibits excellent continuous moldability. Specifically, a lower limit of the epoxy equivalent of the epoxy resin represented by Formula (2A) is set to preferably equal to or more than 150 q/eq, more preferably equal to or more than 160 g/eq, even more preferably equal to or more than 170 g/eq, and still more preferably equal to or more than 180 g/eq. Moreover, an upper limit of the epoxy equivalent is set to preferably equal to or less than 400 g/eq, more preferably equal to or less than 290 g/eq, even more preferably equal to or less than 285 g/eq, still more preferably equal to or less than 260 g/eq, and yet more preferably equal to or less than 240 g/eq. It the lower and upper limits are set within the above range, the number of crosslinking points formed by a reaction between an epoxy group and a hydroxyl group is set within an appropriate range, whereby the Tg of the cured material can be more reliably increased.

If the lower and upper limits are set within the above range, the number of crosslinking points formed by a reaction between the epoxy group and the hydroxyl group is set within an appropriate range, whereby Tq of the cured material can be more reliably increased.

When an epoxy resin, in which hydroxyl groups of Formula (1A) are converted into glycidyl groups at a low rate such as 50%, is used, the hydroxyl groups present in the epoxy resin can play a role of a curing agent.

(Other Components)

The resin composition of the present invention can contain the following components, in addition to the phenol resin curing agent and the epoxy resin.

(Inorganic Filler)

An inorganic filler functions to decrease the amount of moisture that is further absorbed as the resin composition is cured and to reduce deterioration of strength. As the inorganic filler, it is possible to use inorganic fillers that are generally used in the related art.

Examples of the inorganic filler include molten silica, spherical silica, crystalline silica, alumina, silicon nitride, aluminum nitride, and the like. These may be used singly or used by being mixed with each other.

From the viewpoint of filling properties of the inorganic filler filled in a molding cavity, a particle size of the inorganic filler is preferably equal to or greater than 0.01 μm and equal to or less than 150 μm.

The lower limit of the amount of the inorganic filler in the resin composition is preferably equal to or more than 80% by mass, more preferably equal to or more than 93% by mass, and even more preferably equal to or more than 85% by mass, with respect, to the total mass of the resin composition. If the lower limit is within the above range, a degree of increase in the amount of absorbed moisture or a degree of decrease in the strength that results from the curing of the obtained resin composition can be reduced. As a result, a cured material exhibiting excellent solder cracking resistance can be obtained. Moreover, since the proportion of the resin is relatively reduced, the weight reduction ate can be kept low.

The upper limit of the amount of the inorganic filler in the resin composition is preferably equal to or less than 93% by mass, more preferably equal to or less than 91% by mass, and even more preferably equal to or less than 90% by mass with respect to the total mass of the resin composition. If the upper limit is within the above range, the obtained resin composition can exhibit excellent fluidity and moldability.

When a metal hydroxide, which will be described later, such as aluminum hydroxide or magnesium hydroxide, or an inorganic flame retardant such as zinc borate, zinc molybdate, or antimony trioxide is used, it is preferable to control the total amount of the inorganic flame retardant and the inorganic filler to fall within the above range.

(Curing Accelerator)

A curing accelerator functions to accelerate a reaction between an epoxy group of the epoxy resin and a hydroxyl group of the phenol resin-based curing agent. As the curing accelerator, it is possible to use curing accelerators that are generally used in the related art.

Specific examples of the curing accelerator include phosphorus atom-containing compounds such as organic phosphine, tetra-substituted phosphonium compounds, phosphobetaine compounds, adducts composed of a phosphine compound and a quinone compound, and adducts composed of a phosphonium compound and a silane compound; amidines or tertiary amines including, for example, 1,8-diazabicyclo(5,4,0)undecene-7, benzyl dimethyl amine, 2-methylimidazole, and the like; and nitrogen atom-containing compounds such as quaternary salts of the above amidines and amines. One kind of these compounds can be used singly, or two or more kinds thereof can be used in combination. Among these, from the viewpoint of curability, the phosphorus atom-containing compounds are preferable. From the viewpoint of soldering resistance and fluidity, the phosphobetaine compounds and the adducts composed of a phosphine compound and a quinone compound are particularly preferable. Moreover, the phosphorus atom-containing compounds such as tetra-substituted phosphonium compounds and adducts composed of a phosphonium compound and a silane compound are particularly preferable, since these slightly contaminate a mold during continuous molding.

Examples of the organic phosphine usable in the resin composition include primary phosphines such as ethyl phosphine and phenyl phosphine; secondary phosphines such as dimethyl phosphine and diphenyl phosphine; and tertiary phosphines such as trimethyl phosphine, triethyl phosphine, tributyl phosphine, and triphenyl phosphine.

Examples of the tetra-substituted phosphonium compound usable in the resin composition include a compound represented by the following Formula (6).

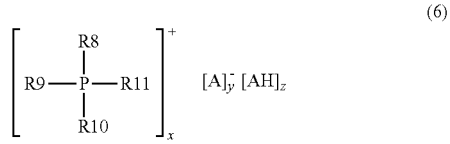

(6)

(In Formula (6), P represents a phosphorus atom; R8, R9, R10, and R11 represent aromatic groups or alkyl groups; A represents an anion of aromatic organic acid having an aromatic ring bonded to at least one functional group selected from a hydroxyl group, a carboxyl group, and a thiol group; AH represents an aromatic organic acid having an aromatic ring bonded to at least one functional group selected from a hydroxyl group, a carboxyl group, and a thiol group; x and y are numbers of 1 to 3; z is a number of 0 to 3; and x=y.)

The compound represented by Formula (6) is obtained by the following method for instance, but is not limited thereto. First, a tetra-substituted phosphonium halide, and aromatic organic acid, and a base are mixed into an organic solvent and evenly mixed with each other, such that aromatic organic acid anions are generated in the solution. If water is then added thereto, the compound represented by Formula (6) can be precipitated. In the compound represented by Formula (6), R8, R9, R10, and R11 bonded to phosphorus atoms are preferably phenyl groups; AH is preferably a compound having a hydroxyl group in an aromatic ring, that is, phenols; and A is preferably an anion of the phenols. Examples of the phenols of the present invention include monocyclic phenols such as phenol, cresol, resorcinol, and catechol; condensed polycyclic phenols such as naphthol, hydroxynaphthalene, and anthraquinone; bisphenols such as bisphenol A, bisphenol F, and bisphenol S; polycyclic phenols such as phenyl phenol and biphenol; and the like.

Examples of the phosphobetaine compounds include a compound represented by Formula (7) and the like.

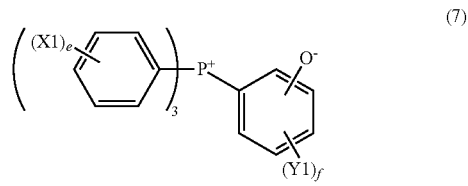

(7)

(In Formula (7), X1 represents an alkyl group having 1 to 3 carbon atoms; Y1 represents a hydroxyl group; e is an integer of 0 to 5; and f is an integer of 0 to 3.)

The compound represented by Formula (7) is obtained by the following process for instance. In the process, first, tri-aromatic substituted phosphine, which is a tertiary phosphine, is brought into contact with a diazonium salt, such that the tri-aromatic substituted phosphine is substituted with a diazonium group contained in the diazonium salt. However, the compound is not limited to the process.

Examples of the adducts composed of a phosphine compound and a quinone compound include a compound represented by Formula (8) and the like.

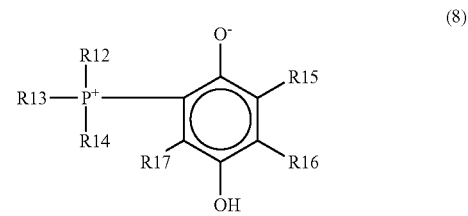

(8)

(In Formula (8), P represents a phosphorus atom; R12, R13, and R14 represent alkyl groups having 1 to 12 carbon atoms or aryl groups having 6 to 12 carbon atoms, and may be the same as or different from each other; R15, R16, and R17 represent hydrogen atoms or hydrocarbon groups having 1 to 12 carbon atoms, and may be the same as or different from each other; and R15 and R16 may form a cyclic group by being bonded to each other.)

As the phosphine compound used for the adducts composed of a phosphine compound and a quinone compound, phosphine compounds having an unsubstituted aromatic ring or having an aromatic ring containing a substituent such as an alkyl group or an alkoxy group, such as triphenylphosphine, tris(alkylphenyl)phosphine, tris(alkoxyphenyl)phosphine, trinaphthylphosphine, and tris(benzyl)phosphine are preferable. Examples of the substituent such as an alkyl group or an alkoxy group include alkyl and alkoxy groups having 1 to 6 carbon atoms. In view of availability, triphenylphosphine is preferable.

Examples of the quinone compound used for the adducts composed of a phosphine compound and a quinone compound include o-benzoquinone, p-benzoquinone, and anthraquinones. Among these, in view of storage stability, p-benzoquinone is preferable.

The adducts composed of a phosphine compound and a quinone compound can be produced by a method in which an organic tertiary phosphine and benzoquinones are brought into contact and mixed with each other in a solvent that can dissolve both the organic tertiary phosphine and benzoquinones. The solvent is preferably ketones such as acetone or methyl ethyl ketone in which the adduct exhibits low solubility, but the solvent is not limited thereto.

The compound represented by Formula (8) is preferably a compound in which R12, R13, and R14 bonded to phosphorus atoms are phenyl groups, and R15, R16, and R17 are hydrogen atoms. That is, the compound is preferably an adduct composed of 1,4-benzoquinone and triphenylphosphine, since this compound reduces a thermal elastic modulus of the cured material of the resin composition.

Examples of the adducts composed of a phosphonium compound and a silane compound include a compound represented by Formula (9) and the like.

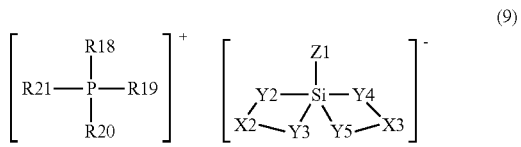

(9)

(In Formula (9), P represents a phosphorus atom; Si represents a silicon atom; each of R18, R19, R20, and R21 represents an organic group having an aromatic ring or a heterocycle or represents an aliphatic group, and may be the same as or different from each other; X2 is an organic group bonded to groups Y2 and Y3; X3 is an organic group bonded to groups Y4 and Y5; Y2 and Y3 represent groups formed when a proton-donating group releases proton; the groups $Y^2$ and $Y^1$ in the same molecule form a chelate structure by being bonded to silicon atoms; Y4 and Y5 represent groups formed when a proton-donating group releases protons; the groups $Y^4$ and $Y^5$ in the same molecule form a chelate structure by being bonded to silicon atoms; X2 and X3 may be the same as or different from each other; Y2, Y3, Y4, and Y5 may be the same as or different from each other; and Z1 represents an organic group having an aromatic ring or a heterocycle or represents an aliphatic group.)

Examples of R18, R19, R20, and R21 in Formula (9) include a phenyl group, a methylphenyl group, a methoxyphenyl group, a hydroxyphenyl group, a naphthyl group, a hydroxynaphthyl group, a benzyl group, a methyl group, an ethyl group, an n-butyl group, an n-octyl group, a cyclohexyl group, and the like. Among these, aromatic groups having substituents such as a phenyl group, a methylphenyl group, a methoxyphenyl group, a hydroxyphenyl group, and a hydroxynaphthyl group, or unsubstituted aromatic groups are more preferable.

In Formula (9), X2 is an organic group boned to Y2 and Y3. Similarly, X3 is an organic group bonded to groups Y4 and Y5. Y2 and Y3 are groups formed when a proton-donating groups releases protons. Y2 and Y3 in the same molecule form a chelate structure by being bonded to silicon atoms. Similarly, Y4 and Y5 are groups formed when a proton-donating group releases protons. Y4 and Y5 in the same molecule form a chelate structure by being bonded to silicon atoms. The groups X2 and X3 may be the same as or different from each other, and the groups Y2, Y3, Y4, and Y5 may be the same as or different from each other. Groups represented by —Y2-X2-Y3- and —Y4-X3-Y5- in Formula (9) are constituted with a group that is formed when a proton-donating compound releases two protons. The proton-donating compound is preferably an organic acid having at least two carboxyl groups or hydroxyl groups in a molecule, more preferably an aromatic compound having at least two carboxyl groups or hydroxyl groups on carbon atoms which form aromatic rings adjacent to each other, and even more preferably an aromatic compound having at Least two hydroxyl groups on carbon atoms which form an aromatic ring and are adjacent to each other. Examples of the proton-donating compound include catechol, pyrogallol, 1,2-dihydroxynaphthalene, 2,3-dihydroxynaphthalene, 2,2'-biphenol, 1,1'-bi-2-naphthol, salicylic acid, 1-hydroxy-2-naphthoic acid, 3-hydroxy-2-naphthoic acid, chloranilic acid, tannic acid, 2-hydroxybenzylalcohol, 1,2-cyclohexanediol, 1,2-propanediol, glycerin, and the like. Among these, catechol, 1,2-dihydroxynaphthalene, and 2,3-dihydroxynaphthalene are more preferable.

Z1 in Formula (9) represents an organic group having an aromatic ring or a heterocycle or represents an aliphatic group. Specific examples thereof include aliphatic hydrocarbon groups such as a methyl group, an ethyl group, a propyl group, a butyl group, a hexyl group and an octyl group and the like; aromatic hydrocarbon groups such as a phenyl group, a benzyl group, a naphthyl group, and a biphenyl group and the like; reactive substituents such as a glycidyloxy propyl group, a mercaptopropyl group, an aminopropyl group, and a vinyl group, and the like. Among these, in view of thermal stability, a methyl group, an ethyl group, a phenyl group, a naphthyl group, and a biphenyl group are more preferable.

In a method for producing the adduct composed of a phosphonium compound and a silane compound, a silane compound such as phenyltrimethoxysilane and a protone-donating compound such as 2,3-dihydroxynaphthalene are put into a flask containing methanol and dissolved, and then a sodium methoxide methanol solution is added dropwise thereto under stirring at room temperature. Thereafter, a solution, which is prepared in advance by dissolving a tetra-substituted phosphonium halide such as tetraphenyl phosphonium bromide in a methanol, is added dropwise to the above solution under stirring at room temperature, whereby crystals are precipitated. The precipitated crystals are filtered, washed with water, and dried in a vacuum, whereby an adduct composed of a phosphonium compound and a silane compound is obtained. However, the method is not limited to the above.

Preferable curing accelerators of the present invention include the compounds represented by Formulae (6) to (9). If these compounds are used to reduce the weight reduction rate and secure moldability, a curing acceleration effect is exhibited at a high temperature, and then the resin composition can be rapidly cured. Herein, if the curing acceleration effect is not exhibited at a low temperature, the resin stays molten for a long time, that is, the resin retains a low viscosity for a long time, and as a result, fluidity thereof is improved. As described above, from the viewpoint of weight reduction, in the present invention, it is effective to decrease the amount of resin causing thermal decomposition by increasing the amount of the inorganic filler filled in a mold. However, if the amount of the inorganic filler filled in a mold is increased, the resin composition is thickened. Therefore, in designing the resin composition of the present invention, it is effective to use a curing accelerator that exhibits a curing acceleration effect at a higher temperature.

In other words, if the compounds represented by Formulae (6) to (9) are used as a curing accelerator, it is possible to prevent the resin composition from being thickened in the process of melting, with increasing the amount of the inorganic filler filled in a mold. Accordingly, the resin composition can be designed to decrease the weight reduction rate.

The proportion of the curing accelerator mixed in is preferably equal to or higher than 0.1% by mass and equal to or lower than 1% by mass of the entire resin composition. If the proportion of the curing accelerator mixed in is within the above range, sufficient curability and fluidity can be obtained.

(Compound in which Each of Two or More Carbon Atoms Constituting an Aromatic Ring and Adjacent to Each Other is Bonded to a Hydroxyl Group)

If a compound (A) in which each of two or more carbon atoms constituting an aromatic ring and adjacent to each other is bonded to a hydroxyl group (hereinafter, the compound will be simply referred to as "compound (A)" in some cases) is used, even when a phosphorus atom-containing curing accelerator not exhibiting latency is used as a curing accelerator that accelerates a crosslinking reaction between the phenol resin-based curing agent and the epoxy resin, it is possible to inhibit the resin composition from causing a reaction while being melted and kneaded.

If the resin composition contains the compound (A), it is preferable since a encapsulating material can be formed under higher shearing conditions, fluidity of the resin composition is improved, and an effect of reducing cleaning cycle of a mold is obtained by inhibiting release components from rising to the surface of a package during continuous molding or being accumulated on the surface of a mold.

The compound (A) has an effect of decreasing molt viscosity and improving fluidity of the resin composition. Moreover, the compound (A) also has an effect of improving soldering resistance, though the detailed mechanism thereof is unclear.

As the compound (A), it is possible to use a monocyclic compound represented by Formula (10) or a polycyclic compound represented by Formula (11), and these compounds may have substituents other than a hydroxyl group.

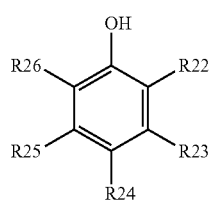

(10)

(In Formula (10), either R22 or R26 is a hydroxyl group; when one of R22 and R26 is a hydroxyl group, the other is a hydrogen atom, a hydroxyl group, or a substituent other than a hydroxyl group; and R23, R24, and R25 are hydrogen atoms, hydroxyl groups, or substituents other than hydroxyl groups.)

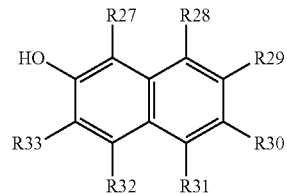

(11)

(In Formula (11), either R27 or R33 is a hydroxyl group; when one of R27 and R33 is a hydroxyl group, the other is a hydrogen atom, a hydroxyl group, or a substituent other than a hydroxyl group; and R20, R29, R30, R31, and R32 are hydrogen atoms, hydroxyl groups, or substitutents other than hydroxyl groups.)

Specific examples of the monocyclic compound represented by Formula (10) include catechol, pyrogallol, gallic acid, and gallic acid ester, and derivatives of these.

Specific examples of the polycyclic compound represented by Formula (11) include 1,2-dihydroxynaphthalene, 2,3-dihydroxynaphthalene, and derivatives of these. Among these, in view of ease of controlling fluidity and curability, a compound in which each of two carbon atoms constituting an aromatic ring and adjacent to each other is bonded to a hydroxyl group is preferable. Considering volatilization of the compound in a kneading process, it is preferable to use a compound which has a low-volatile naphthalene Ling exhibiting a high degree of weighing stability as a mother nucleus. In this case, specifically as the compound (A), it is possible to use compounds having a naphthalene ring, such as 1,2-dihydroxynaphthalene, 2,3-dihydroxynaphthalene, and derivatives thereof. One kind of the compound (A) may be used singly, or two or more kinds thereof may be used in combination.

The proportion of the compound (A) mixed in is preferably equal to or higher than 0.01% by mass and equal to or lower than 1% by mass, more preferably equal to or higher than 0.03% by mass and equal to or lower than 0.8% by mass, and particularly preferably equal to or higher than 0.05% by mass and equal to or lower than 0.5% by mass in the entire rein composition. If the lower limit of the proportion of the compound (A) mixed in is within the above range, viscosity of the resin composition can be reduced to a sufficient degree, and a fluidity improving effect can be obtained. If the proportion of the compound (A) mixed in is within the range, curability of the resin composition and physical properties of the cured material are less likely to deteriorate.

(Coupling Agent)

A coupling agent functions to improve adhesiveness between the epoxy resin and the inorganic filler when the resin composition contains the inorganic filler, and for example, a silane coupling agent and the like are used.

As the silane coupling agent, various silane coupling agents can be used. Among these, it is preferable to use aminosilane. If aminosilane is used, fluidity and soldering resistance of the resin composition can be improved.

The aminosilane is not particularly limited, and examples thereof include γ-aminopropyltriethoxysilane, γ-aminopropyltrimethoxysilane, N-β(aminoethyl) γ-aminopropyltrimethoxysilane, N-β(aminoethyl) γ-aminopropylmethyldimethoxysilane, N-phenyl γ-aminopropyltriethoxysilane, N-phenyl γ-aminopropyltrimethoxysilane, N-β(aminoethyl) γ-aminopropyltriethoxysilane, N-6-(aminohexyl) 3-aminopropyltrimethoxysilane, N-(3-(trimethoxysilylpropyl)-1,3-benzenedimethanamine, and the like.

The aminosilane exhibits excellent adhesiveness. However, the aminosilane reacts with and is bonded to the inorganic filler in the resin composition or an epoxy group of the epoxy resin at a relatively low temperature. As a result, the aminosilane fails to adhere to a metal surface to a sufficient degree or fails to form a bond with a metal surface in some cases. If a silane coupling agent having a secondary amine structure is used as a coupling agent, fluidity and soldering resistance can be balanced to a higher level. Presumably, the following may be the reason. That is, since the divalent hydroxyphenylene structure in the phenol resin-based curing agent is acidic, if the above silane coupling agent is concurrently used with a silane coupling agent having a secondary amine structure which is a secondary amine having a higher basicity, acid-base interaction is established, and as a result, the two kinds of silane coupling agents exert a capping effect on each other.

That is, due to the capping effect, a reaction between the silane coupling agent having a secondary amine structure and the epoxy resin and a reaction between the phenol resin-based curing agent and the epoxy resin are delayed, apparent fluidity of the resin composition is improved. It is considered that for this reason, the silane coupling agent having a secondary amine structure can be adsorbed onto and bonded to a metal surface to a higher degree.

The silane coupling agent having a secondary amine structure is not particularly limited, and examples thereof include N-β(aminoethyl)γ-aminopropyltriethoxysilane, N-β(aminoethyl) γ-aminopropylmethyldimethoxysilane, N-phenyl γ-aminopropyltriethoxysilane, N-phenyl γ-aminopropyltriethoxysilane, N-β(aminoethyl)γ-aminoprop yltriethoxysilane, N-6-(aminohexyl)3-aminopropyltrimethoxysilane, N-(3-(trimethoxysilylpropyl)-1,3-benzenedimethanamine, and the like. Among these, silane coupling agents having a phenyl group and a secondary amine structure, such as N-phenyl γ-aminopropyltriethoxysilane, N-phenylγ-aminopropyltrimethoxysilane, and N-(3-(trimethoxysilylpropyl)-1, 3-benzenedimethanamine, are preferable since these exhibit excellent fluidity and slightly contaminate a mold during continuous molding. As such coupling agents, one kind of the above aminosilane may be used singly, or two or more kinds thereof may be used concurrently. Alternatively, the aminosilane may be used concurrently with other silane coupling agents. Other silane coupling agents that can be concurrently used are not particularly limited, and examples thereof include epoxysilane, aminosilane, ureidosilane, mercaptosilane, and the like. Among these, it is preferable to use silane coupling agents that enhance interfacial strength between the epoxy resin and the inorganic filler by reacting with the epoxy resin and the inorganic filler. In addition, by being concurrently used with the aforementioned compound (A), the silane coupling agent can improve the effect of the compound (A) that improves the fluidity of the resin composition by decreasing the melt viscosity of the resin composition.

Examples of the epoxysilane include γ-glycidoxypropyltriethoxysilane, γ-glycidoxypropyltrimethoxysilane, γ-glycidoxypropylmethyldimethoxysilane, β-(3,4-epoxycyclohexyl)ethyltrimethoxysilane, and the like. Examples of the ureidosilane include γ-ureidopropyltriethoxysilane, hexamethyldisilazane, and the like. Moreover, latent aminosilane coupling agents, in which a primary amino moiety of aminosilane is protected by being reacted with ketone or aldehyde, may be used. As the mercaptosilane, for example, γ-mercaptopropyltrimethoxysilane, 3-mecaptopropylmethyldimethoxysilane, silane coupling agents such as bis(3-triethoxysilylpropyl)tetrasulfide and bis(3-triethoxysilylpropyl)disulfide which carry out function similar to that of the mercaptosilane coupling agent by thermal decomposition, and the like may be used. In addition, as these silane coupling agents, silane coupling agents having undergone a hydrolysis reaction may be mixed into the resin composition. One kind of these silane coupling agents may be used alone, or two or more kinds thereof may be used concurrently.

Among other silane coupling agents that can be concurrently used with the aminosilane, from the viewpoint of adhesiveness with respect to polyimide on a silicon chip surface or to an organic member such as a solder resist on the substrate surface, the epoxysilane is preferable, and from the viewpoint of continuous moldability, the mercaptosilane is preferable.

The lower limit of the proportion of the coupling agent such as a silane coupling agent mixed in is preferably equal to or more than 0.01% by mass, more preferably equal to or more than 0.05% by mass, and particularly preferably equal to or more than 0.1% by mass in the entire resin composition. If the lower limit of the proportion of the coupling agent such as a silane coupling agent mixed in is within the above range, an electronic device can obtain excellent solder cracking resistance without decreasing interfacial strength between the epoxy resin and the inorganic filler. The upper limit of the proportion of the coupling agent such as a silane coupling agent mixed iii is preferably equal to or less than 1% by mass, more preferably equal to or less than 0.8% by mass, and particularly preferably equal to or less than 0.6% by mass in the entire resin composition. If the upper limit of the proportion of the coupling agent such as a silane coupling agent mixed in is within the above range, a device can obtain excellent solder cracking resistance without decreasing interfacial strength between the epoxy resin and the inorganic filler. Moreover, if the proportion of the coupling agent such as a silane coupling agent mixed in is within the range, an electronic device can obtain excellent solder cracking resistance without enhancing water-absorbing properties of the cured material of the resin composition.

(Inorganic Flame Retardant)

An inorganic flame retardant functions to improve flame retardancy of the resin composition, and as the inorganic flame retardant, inorganic flame retardants that are in general use are utilized.

Specifically, metal hydroxides that hinder a combustion reaction by causing dehydration and absorbing heat during combustion or composite metal hydroxides that can shorten the combustion time are preferably used.

Examples of the metal hydroxides include aluminum hydroxide, magnesium hydroxide, calcium hydroxide, barium hydroxide, and zirconia hydroxide.

The composite metal hydroxides may be hydrotalcite containing two or more kinds of metal elements. In the hydrotalcite, at least one of the metal elements may be magnesium, and the other metal element may be a metal element selected from calcium, aluminum, tin, titanium, iron, cobalt, nickel, copper, and zinc. As such composite metal hydroxides, solid solutions consisting of magnesium hydroxide and zinc are easily obtained in the form of commercially available products.

Among these, from the viewpoint of balance between soldering resistance and continuous moldability, aluminum hydroxide and the solid solution consisting of magnesium hydroxide and zinc are preferable.

One kind of the inorganic flame retardant may be used singly, or two or more kinds thereof may be used. Moreover, in order to reduce the influence exerted on continuous moldability, the flame retardant may be used after being subjected to surface treatment by using a silicon compound such as a silane coupling agent, an aliphatic compound such as wax, and the like.

In the present invention, the above inorganic flame retardant may be used. However, provided that a weight of an inorganic flame retardant that is yielded when the retardant is subjected to a drying process for 20 hours at 125° C. and then cooled in a desiccators is an initial weight, and a weight of the inorganic flame retardant that is yielded when the retardant is subjected to a heating process for 1,000 hours by being put in a high-temperature chamber at 200° C. and then cooled in a desiccators is a post-process weight, if the post-process weight is reduced by equal to or higher than 0.1% by weight compared to the initial weight, it is preferable not to use such a flame retardant. In addition, it is desirable to constitute the resin composition only with a flame retardant resin, without using an inorganic flame retardant.

That is, in the resin composition of the present invention, both the phenol resin-based curing agent represented by Formula (1A) and epoxy resin represented by Formula (2A) that are contained as essential components in the resin composition have a biphenyl skeleton exerting a flame retarding effect. As a result, they have a high degree of flame retardancy and functions as a flame retardant. For this reason, even if a metal hydroxide-based flame retardant, which may release water at a high temperature equal to or higher than 200° C. and thus increase the weight reduction rate of the cured material, is not mixed into the resin composition, the resin composition can have the same characteristics as in the case where the flame retardant is added to the resin composition.

Further, in addition to other components described above, colorants such as carbon black, red iron oxide, and titanium oxide; release agents such as natural wax like carnauba wax and the like, synthetic wax like polyethylene wax and the like, higher fatty acids and metal salts thereof such as stearic acid, and zinc stearate, or paraffin; and low-stress additives such as silicone oil and silicone rubber may be appropriately mixed into the resin composition.

Moreover, if the phenol resin-based curing agent, epoxy resin, and other components are evenly mixed with each other at a room temperature by using, for example, a mixer or the like, followed by melting and kneading if necessary by using a heating roller, a kneader, or a kneading machine such as an extruder, and then cooled and pulverized if necessary, dispersity, fluidity, and the like of the resin composition of the present invention can be adjusted to a desired level.

In the present embodiment, the electronic device of the present invention is not limited to the above description and can be preferably applied to semiconductor packages in various forms. For example, the electronic device can be applied not only to packages used for memories or logic elements, such as a dual in-line package (DIP), a plastic leaded chip carrier (PLCC), a quad flat package (QFP), a low-profile quad flat package (LQFP), a small outline package (SOP), a small outline J-lead package (SOJ), a thin small outline package (TSOP), a thin quad flat package (TQFP), a tape carrier package (TCP), a ball grid array (BGA), a chip size package (CSP), a matrix array package ball grid array (MAPBGA), and a chip-stacked chip size package, but also to packages such as TO-220 equipped with a power element such as a power transistor.

The resin composition of the present invention can be obtained by mixing the phenol resin curing agent with the epoxy resin and optionally other components described above, by a method commonly used in the related art.

A cured material of the resin composition of the present invention obtained as above has a glass transition temperature (Tg) equal to or higher than 200° C. When the cured material is heated for 1,000 hours at 200° C. in the atmosphere, a weight reduction rate thereof becomes equal to or lower than 0.3%, and preferably becomes equal to or lower than 0.2%.

In an embodiment of the present invention, when the resin composition is measured for obtaining a Koka's viscosity by using a Koka-type viscometer (manufactured by Shimadzu Corporation, CFT500) and a nozzle having a diameter of 0.5 mm$\phi$ and a length of 1 mm at a temperature of 125° C. under a load of 40 kg, the Koka's viscosity is equal to or higher than 1 Pa·s and equal to or lower than 14 Pa·s and preferably equal to or higher than 2 Pa·s and equal to or lower than 13 Pa·s. If the Koka's viscosity is within the above range, when the resin composition is used for encapsulating an electronic component, low-temperature moldability of the resin becomes excellent.

In an embodiment of the present invention, a flexural modulus at 260° C. of a cured material of the resin composition is equal to or greater than 1,500 N/mm$^2$ and equal to or less than 2,500 N/mm$^2$, and more preferably equal to or greater than 1,600 N/mm$^2$ and equal to or less than 2,400 N/mm$^2$. If the flexural modulus is within the above range, it is possible to reduce thermal stress of the cured material.

In an embodiment of the present invention, a water absorption rate of the resin composition is equal to or higher than 0.1% and equal to or lower than 0.35%. If the water absorption rate is within the above range, when the resin composition is used for encapsulating an electronic component, the moldability of the resin becomes excellent.

Up to now, the resin composition and the electronic device of the present invention have been described, but the present invention is not limited to the above description.

For example, optional components that can carry out the same function as described above may be added to the resin composition of the present invention.

Moreover, the constituents of each part of the electronic device of the present invention may be replaced with optional members that can carry out the same function as described above. Alternatively, members constituted with optional constituents may be added to the electronic device.

EXAMPLES

Next, specific examples of the present invention will be described.

However, the present invention is not limited to the description of these examples.

1. Preparation of Raw Materials

First, raw materials used for the resin compositions of each of the examples, reference examples, and comparative examples will be described below.

The amount of each component mixed in is based on "part (s) by mass" unless otherwise specified.

(Phenol Resin Curing Agent 1; Synthesis of MFBA-Type Phenol)

A separable flask was equipped with a stirring device, a thermometer, a reflux condenser, and a nitrogen inlet, and 291 parts by mass of 1,3-dihydroxybenzene (manufactured by Tokyo Chemical Industry Co., Ltd., "Resorcinol", melting point 111° C., molecular weight 110, purity 99.4%), 235 parts by mass of phenol (special-grade reagent manufactured by KANTO KAGAKU., "Phenol", melting point 41° C., molecular weight 94, purity 99.3%), and 125 parts by mass of 4,4'-bischloromethylbiphenyl (manufactured by Wako Pure Chemical Industries, Ltd., "4,4'-Bischloromethylbiphenyl", melting point 126° C., purity 95%, molecular weight 251) which had been atomized in advance were weighed and put into the separable flask. The resultant was heated under nitrogen purging, and stirred as soon as phenol started to be melted.

Thereafter, in a state where the Internal temperature of the system was being kept within a range of 110° C. to 130° C., the resultant was reacted for 3 hours and then heated. Subsequently, in a state where the temperature was being kept within a range of 140° C. to 160° C., the resultant was reacted for 3 hours.

In addition, hydrochloric acid gas generated inside the system by the reaction was discharged out of the system by a nitrogen gas flow.

After the reaction ended, unreacted components were distilled away at 150° C. under a pressure reduced to 2 mmHg. Thereafter, 400 parts by mass of toluene was added thereto, evenly dissolved, and then transferred to a separating funnel. 150 parts by mass of distilled water was then added thereto, followed by shaking, and an operation (washing with water) for removing an aqueous layer was repeated until the water for washing became neutral. Next, an oil layer was depressurized at 125° C. so as to distill away volatile components such as toluene and residual unreacted components, thereby obtaining a phenol resin curing agent 1 (polymer) represented by the following Formula (12A). In the phenol resin curing agent 1, a hydroxyl equivalent was 135.

Moreover, an average k0 of a repeating number k of a structural unit having one hydroxyl group and an average m0 of a repeating number m of a structural unit having two hydroxyl groups were obtained by conducting arithmetical calculation, by regarding a relative intensity ratio measured and analyzed by Field Desorption Mass Spectrometry (FD-MS) as a mass ratio. As a result, a ratio of k0/m0 was confirmed to be 0.98/1, and a number average molecular weight was confirmed to be 460.

The number average molecular weight was measured using Alliance (2695 separations module, 2414 refractive index detector, TSK gel GMHHR-L×2+TSK guard column HHR-L×1, mobile phase: THF, 0.5 ml/min) manufactured by Waters, by performing gel permeation chromatography (GPC) under conditions of a column temperature of 40.0° C., a temperature of a differential refractometer of 40.0° C., and an amount of sample injected of 100 μl.

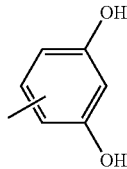

(12C)

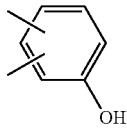

(12D)

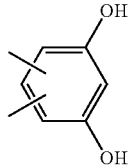

(12E)

(Phenol Resin Curing Agent 2; Synthesis of MFBA-Type Phenol)

A phenol resin curing agent 2 (polymer) represented by Formula (12A) was obtained in the same manner as in the section of (Phenol Resin Curing Agent 1: Synthesis of MFBA-Type Phenol), except that resorcinol was used in an amount of 374 parts by mass, phenol was used in an amount of 141 part by mass, and 4,4'-bischloromethylphenyl was used in an amount of 100 parts by mass.

In the phenol resin curing agent 2, a hydroxyl equivalent was 120.

Moreover, an average k0 of a repeating number k of a structural unit having one hydroxyl group and an average m0 of a repeating number m of a structural unit having two hydroxyl groups were obtained by conducting arithmetical calculation, by regarding a relative intensity ratio measured and analyzed by Field Desorption Mass Spectrometry as a mass ratio. As a result, a ratio of k0/m0 was confirmed to be 0.51/1, and a number average molecular weight was confirmed to be 480.

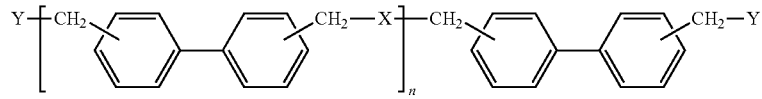

(12A)

(In Formula (12A), each of two Ys independently represents a hydroxyphenyl group represented by the following Formula (12B) or the following Formula (12C); and X represents a hydroxyphenylene group represented by the following Formula (120) or the following Formula (12E).)

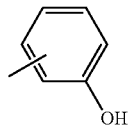

(12B)

(Phenol Resin Curing Agent 3: Preparation of BA-Type Phenol)

A phenol aralkyl resin (manufactured by MEIWA PLASTIC INDUSTRIES LTD., MEH-7851SS, hydroxyl equivalent 203 g/eq) having a biphenylene skeleton was prepared.

(Phenol Resin Curing Agent 4: Preparation of TPM-Typo Phenol)

A triphenylmethane-type phenol resin (manufactured by MEIWA PLASTIC INDUSTRIES LTD., MEH-7500, hydroxyl equivalent 97 g/eq) was prepared.

(Epoxy Resin (a-1); Synthesis of MFBA-Type Epoxy)

A separable flask was equipped with a stirring device, a thermometer, a reflux condenser, and a nitrogen inlet, and 100 parts by mass of the phenol resin curing agent 1, 300 parts by mass of epichlorohydrin (manufactured by Tokyo Chemical Industry Co., Ltd.), and 50 parts by mass of toluene were weighed and put into the flask. After the resultant was dissolved by being heated at 100° C., 45 parts by mass of sodium hydroxide (fine granular solid reagent having a purity of 99%) was slowly added thereto over 3 hours, and the resultant was reacted for 2 hours. Thereafter, 200 parts by mass of toluene was added thereto and dissolved, and then 150 parts by mass of distilled water was added thereto, followed by shaking. An operation (washing with water) for removing an aqueous layer was repeated until the water for washing became neutral, and then an oil layer was depressurized to 2 mmHg at 125° C. so as to distill away epichlorohydrin. 300 parts by mass of methyl isobutyl ketone was added to the obtained solids and dissolved, and the resultant was heated to 70° C. Subsequently, 9.5 parts by mass of a 30% by mass aqueous sodium hydroxide solution was added thereto over 1 hour, and then the resultant was reacted for 1 hour and allowed to standstill, and an aqueous layer was removed. An operation of washing the resultant with water was performed by adding 150 parts by mass of distilled water to an oil layer, and the same operation was repeated until the water for washing became neutral. Thereafter, the resultant was heated under reduced pressure to distill away methyl isobutyl ketone, thereby obtaining an epoxy resin (a-1).

The epoxy resin (a-1) is a compound represented by the following Formula (13A) in which a portion of glycidyl ether groups remains as hydroxyl groups, and thus the epoxy equivalent thereof becomes 220 g/eq. As a result, the value of M(M+N) was confirmed to be 0.38. That is, a theoretical epoxy equivalent of the epoxy resin represented by Formula (13A) that was calculated from a hydroxyl equivalent of 135 of the phenol resin curing agent 1 as a raw material was 191. Accordingly, provided that a total number of glycidyl other groups contained in each of the polymers of the epoxy resin (a-1) is M, and a total number of hydroxyl groups contained in each of the polymers is N, the value of M/(M+N) was confirmed to be 0.87. Moreover, the epoxy resin (a-1) had a number average molecular weight of 530.

When the obtained epoxy resin (a-1) was reacted with an excess amount of acetylation agent and then analyzed by NMR, it was confirmed that about 13% of the generated esters was esters based on phenolic hydroxyl groups. This result supported the fact that the epoxy resin contains residual hydroxyl groups that accounts for a proportion of 0.13 with respect to the theoretical epoxy equivalent.

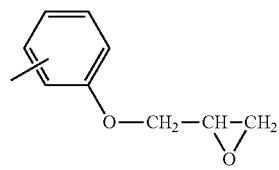

(13B)

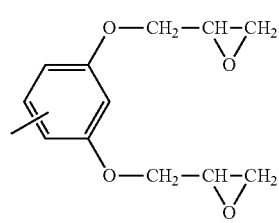

(13C)

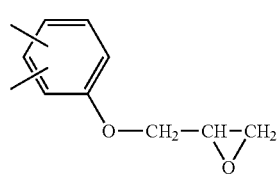

(13D)

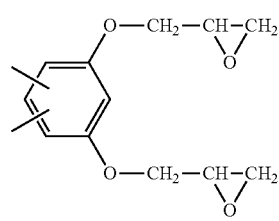

(13E)

(Epoxy Resin (a-2); Synthesis of MFBA-Type Epoxy)

An epoxy resin (A-2) was obtained in the same manner according to the same sequence as in the case of the epoxy resin (a-1), except that the phenol resin curing agent 2 (120 parts by mass) was used.

The epoxy resin (a-2) had an epoxy equivalent of 190 g/eq, and as a result, the value of M(M+N) was confirmed to be 0.93. That is, a theoretical epoxy equivalent of the epoxy resin represented by Formula (13A) that was calculated from a

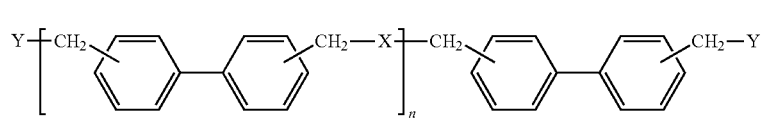

(13A)

(In Formula (13A), each of two Ys independently represents a glycidylated phenyl group represented by the following Formula (13B) or Formula (13C); and X represents a glycidylated phenylene group represented by the following Formula (13D) or the following Formula (13E).)

hydroxyl equivalent of 120 of the phenol resin curing agent 2 as a raw material was 176. Accordingly, the value of M/(M+N) of the epoxy resin (a-2) was confirmed to be 0.93. Moreover, the epoxy resin (a-2) had a number average molecular weight of 650.

(Epoxy Resin (a-3); Synthesis of MFBA-Type Epoxy)

A separable flask was equipped with a stirring device, a thermometer, a reflux condenser, and a nitrogen inlet, and 100 parts by mass of the phenol resin curing agent 1 and 600 parts by mass of epichlorohydrin (manufactured by Tokyo Chemical Industry Co., Ltd) were weighed and put into the flask. After the resultant was dissolved by being heated at 100° C., 90 parts by mass of sodium hydroxide (fine granular solid reagent having a purity of 99%) was slowly added thereto for over 4 hours, and the resultant was reacted for 3 hours. Thereafter, 200 parts by mass of toluene was added thereto and dissolved, and then 150 parts by mass of distilled water was added thereto, followed by shaking. An operation (washing with water) for removing an aqueous layer was repeated until the water for washing became neutral, and then an oil layer was depressurized to 2 mmHg at 125° C. so as to distill away epichlorohydrin. 300 parts by mass of methyl isobutyl ketone was added to the obtained solids and dissolved, and the resultant was heated to 70° C. Subsequently, 19 parts by mass of a 30% by mass aqueous sodium hydroxide solution was added thereto for over 1 hour, and then the resultant was reacted for 1 hour and allowed to standstill, and an aqueous layer was removed. An operation of washing the resultant with water was performed by adding 150 parts by mass of distilled water to an oil layer, and the same operation was repeated until the water for washing became neutral. Thereafter, the resultant was heated under reduced pressure to distill away methyl isobutyl ketone, thereby obtaining an epoxy resin (a-3).

The epoxy resin (a-3) is a compound represented by the following Formula (13A) in which a portion of glycidyl ether groups remains as hydroxyl groups, and thus the epoxy equivalent thereof becomes 193 g/eq. As a result, the value of M(M+N) was confirmed to be 0.99. That is, a theoretical epoxy equivalent of the epoxy resin represented by Formula (13A) that was calculated from a hydroxyl equivalent of 135 of the phenol resin curing agent 1 as a raw material was 191. Accordingly, the value of M/(M+N) of the epoxy resin (a-3) was confirmed to be 0.99. The epoxy resin (a-3) had a number average molecular weight of 650.

(Epoxy Resin (a-4); Preparation of BA-Type Epoxy)

A phenol aralkyl resin-type epoxy resin (manufactured by Nippon Kayaku Co., Ltd., NC3000, epoxy equivalent 276 g/eq) having a biphenylene skeleton was prepared.

(Epoxy Resin (a-5); Preparation of TPM-Type Epoxy)

A triphenylmethane-type epoxy resin (manufactured by Mitsubishi Chemical Corporation, 1032H-60, epoxy equivalent 171 g/eq) was prepared.

(Epoxy Resin (b-1); Synthesis of MFBA-Type Epoxy)

A separable flask was equipped with a stirring device, a thermometer, a reflux condenser, and a nitrogen inlet, and 100 parts by mass of the phenol resin curing agent 1 and 400 parts by mass of epichlorohydrin (manufactured by Tokyo Chemical Industry Co., Ltd) were weighed and put into the flask. After the resultant was dissolved by being heated at 100° C., 60 parts by mass of sodium hydroxide (fine granular solid reagent having a purity of 99%) was slowly added thereto for over 4 hours, and the resultant was reacted for 3 hours. Thereafter, 200 parts by mass of toluene was added thereto and dissolved, and then 150 parts by mass of distilled water was added thereto, followed by shaking. An operation (washing with water) for removing an aqueous layer was repeated until the water for washing became neutral, and then an oil layer was depressurized to 2 mmHg at 125° C. so as to distill away epichlorohydrin. 300 parts by mass of methyl isobutyl ketone was added to the obtained solids and dissolved, and the resultant was heated to 70° C. Subsequently, 13 parts by mass of a 30% by mass aqueous sodium hydroxide solution was added thereto for over 1 hour, and then the resultant was reacted for 1 hour and allowed to standstill, and an aqueous layer was removed. An operation of washing the resultant with water was performed by adding 150 parts by mass of distilled water to an oil layer, and the same operation was repeated until the water for washing became neutral. Thereafter, the resultant was heated under reduced pressure to distill away methyl isobutyl ketone, thereby obtaining an epoxy resin (b-1) containing a compound represented by the following Formula (13A) (epoxy equivalent 200 g/eq). The epoxy resin (b-1) had a number average molecular weight of 560.

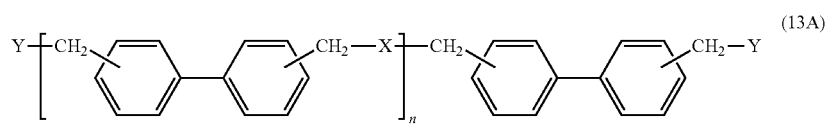

(In Formula (13A), each of two Ys independently represents a glycidylated phenyl group represented by the following Formula (13B) or the following Formula (3C); and X represents a glycidylated phenylene group represented by the following Formula (13D) or the following Formula (13E).)

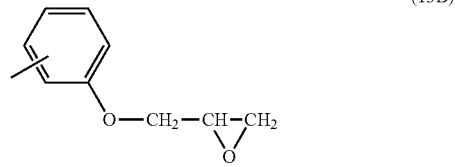

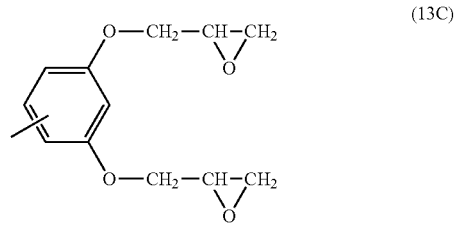

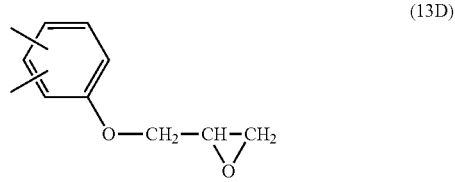

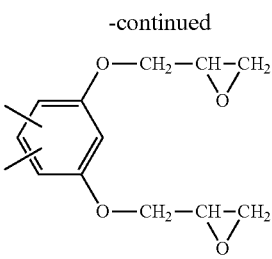

(Epoxy Resin (b-2); Synthesis of MFBA-Type Epoxy)

An epoxy resin 2 (epoxy equivalent 185 g/eq) containing the compound represented by Formula (13A) was synthesized according to the same sequence as in the case of the epoxy resin (b-1), except that the phenol resin curing agent 2 (120 parts by mass) was used. The temperature epoxy resin 2 had a number average molecular weight of 670.

(Epoxy Resin (b-3); Preparation of BA-Type Epoxy)

A phenol aralkyl resin-type epoxy resin (manufactured by Nippon Kayaku Co., Ltd., NC3000, epoxy equivalent 276 g/eq) having a biphenylene skeleton was prepared.

(Epoxy Resin (b-4); Preparation of TPM-Type Epoxy)

A triphenylmethane-type epoxy resin (manufactured by Mitsubishi Chemical Corporation, 1032H-60, epoxy equivalent 171 g/eq) was prepared.

(Inorganic Filler 1)

As an inorganic filler, molten spherical silica (manufactured by DENKI KAGAKU KOGYO KABUSHIKI KAISHA., "FB560", average particle size 30 μm) was prepared.

(Inorganic Filler 2)

As an inorganic filler 2, molten spherical silica ("SO-25R" manufactured by Admatechs., average particle size 0.5 μm) was prepared.

(Curing Accelerator 1)

As a curing accelerator 1, triphenylphosphine (manufactured by KI Chemical Industry Co., Ltd., "PP-360") was prepared.

(Curing Accelerator 2)

As a curing accelerator 2, a curing accelerator represented by the following Formula (14) was prepared.

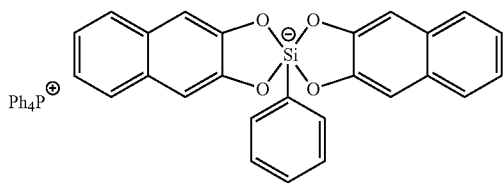

[Method for Synthesizing Curing Accelerator 2]

249.5 g of phenyltrimethoxysilane and 384.0 g of 2,3-dihydroxynaphthalene were put in a flask containing 1,800 g of methanol and dissolved, and then 231.5 g of a 28% sodium methoxide-methanol solution was added dropwise thereto under stirring at room temperature. Thereafter, a solution that had been prepared in advance by dissolving 503.0 g of tetraphenyl phosphonium bromide in 600 g of methanol was added dropwise thereto under stirring at room temperature, whereby crystals were precipitated. The precipitated crystals were filtered, washed with water, and dried in a vacuum, thereby obtaining a crystalline curing accelerator 2 which was light pink in color.

(Silane Coupling Agent 1)

As a silane coupling agent γ-mercaptopropyltrimethoxysilane (manufactured by Shin-Etsu Chemical Co., Ltd., KBM-803) was prepared.

(Inorganic Flame Retardant 1)

As an inorganic flame retardant 1, aluminum hydroxide (manufactured by SUMITOMO CHEMICAL Co., Ltd., CL-303; weight reduction rate of 0.25% at 200° C./1,000 hrs) was prepared.

(Wax)

As a wax, carnauba (manufactured by Nikko Fine Co., Ltd, "Nikko Carnauba", melting point 83° C.) was prepared.

(Colorant)

As a colorant, carbon black (manufactured by Mitsubishi Chemical Corporation, "MA 600") was prepared.

2. Production of Resin Composition

Example (a-1)

The phenol resin curing agent 1 (5.34 parts by mass), the epoxy resin (a-1) (8.71 parts by mass), the inorganic filler 1 (75.00 parts by mass), the inorganic filler 2 (10.00 parts by mass), the curing accelerator 1 (0.15 parts by mass), the silane coupling agent 1 (0.20 parts by mass), the wax (0.30 parts by mass), and the colorant (0.30 parts by mass) were weighed respectively and mixed with each other by a mixer. Thereafter, the mixture was cooled and then pulverized, thereby obtaining a resin composition of Example (a-1).

Examples (a-2) to (a-7), Reference Examples (a-1.) and (a-2), and Comparative Examples (a-1) and (a-2)

Resin compositions of Examples (a-2) to (a-7), Reference Examples (a-1) and (a-2), and Comparative Examples (a-1) and (a-2) were obtained in the same manner as in Example (a-1), except that the type and weighed amount of the the phenol resin curing agent, the epoxy resin, the inorganic filler, and the curing accelerator were changed as shown in Table 1.

Example (b-1)

The phenol resin curing agent 1 (5.66 parts by mass), the epoxy resin (b-1) (8.39 parts by mass), the inorganic filler 1 (75.00 parts by mass), the inorganic filler 2 (10.00 parts by mass), the curing accelerator 1 (0.15 parts by mass), the silane coupling agent 1 (0.20 parts by mass), the wax (0.30 parts by mass), and the colorant (0.30 parts by mass) were weighed respectively and mixed with each other by a mixer. Thereafter, the mixture was kneaded with two rolls having a surface temperature of 95° C. and 25° C. respectively, thereby obtaining a kneaded material. Subsequently, the kneaded material was cooled and then pulverized, thereby obtaining a resin composition of Example (b-1).

Examples (b-2) to (b-7), Reference Example (b-1), and Comparative Examples (b-1) and (b-2)

Resin composition s of Examples (b-2) to (b-7), Reference Example (b-1), and Comparative Examples (b-1) and (b-2) were obtained in the same manner as in Example (a-1), except that the type and weighed amount of the phenol resin curing agent, the epoxy resin, the inorganic filler, and the curing accelerator were changed as shown in Table 2.

3. Evaluation

The obtained resin composition of each of the examples and comparative examples was evaluated by the following method.

3-1. Evaluation of Spiral Flow (SF)

By using a low-pressure transfer molding machine (manufactured by Kohtaki Precision Machine Co., Ltd., "KTS-15"), the resin composition of each of the examples, reference examples, and comparative examples was injected into a mold for spiral flow measurement based on ANSI/ASTM D 3123-72 at 175° C. under conditions of an injection pressure of 6.9 MPa and a pressure-holding time of 120 seconds. In this manner, a flow length was measured and taken as a spiral flow.

The spiral flow is a parameter of fluidity, and the higher the value of the spiral flow is, the better the fluidity is. The unit of the spiral flow is cm. In order that the resin composition is applied to a Sic or GaN power semiconductor package so as to encapsulate the module, it is preferable for the spiral flow thereof to be equal to or greater than 60 cm.

3-2. Evaluation of Glass Transition Temperature (Tg)

The glass transition temperature of the resin composition of each of the examples and comparative examples was measured based on JIS K 6911.

That is, by using a transfer molding machine, the resin composition of each of the examples and comparative examples was formed into a test piece of 80 mm×10 mm×4 mm at a mold temperature of 175° C. and an injection pressure of 6.9 MPa for a curing time of 90 seconds, and the test piece was subjected to post-curing for 2 hours at 175° C. Thereafter, dynamic viscoelasticity thereof was measured (temperature Increase rate: 5° C./min, frequency: 10 Hz, load: 800 g) using "DDV-25GP" manufactured by A&D Company, Limited, and a tan δ peak temperature was interpreted as a glass transition temperature.

3-3. Evaluation of Flame Resistance

By using a low-pressure transfer molding machine (manufactured by Kohtaki Precision Machine Co., Ltd., "KTS-30"), the resin composition of each of the examples, reference examples, and comparative examples was injection-molded under conditions of a mold temperature of 175° C., an injection time of 15 seconds, a curing time of 120 seconds, and an injection pressure of 9.8 MPa, thereby preparing a flame resistance test piece having a thickness of 3.2 mm.

A flame resistance test was performed on the obtained flame resistance test piece according to the standard of UL94 vertical flame test.

Tables 1 and 2 show the determined rank (class) of flame resistance.

3-4. Evaluation of Weight Reduction Rate

By using a low-pressure transfer molding machine (manufactured by Kohtaki Precision Machine Co., Ltd., "KTS-30"), the resin composition of each of the examples, reference examples, and comparative examples was formed into a discoid test piece having a diameter of 50 mm and a thickness of 3 mm under conditions of a mold temperature of 175° C., an injection pressure of 9.8 MPa, and a curing time of 120 seconds, and the test piece was subjected to curing for 4 hours at 175° C. Thereafter, the test piece was subjected to a drying process for 20 hours at 125° C. and cooled. The weight of the test piece obtained after cooling was taken as an initial weight. Subsequently, the discoid test piece was put into a high-temperature chamber at 200° C. in the atmosphere, subjected to a heating process for 1,000 hours, and cooled. The weight of the test piece obtained after cooling was taken as a post-process weight.

Tables 1 and 2 show the weight reduction rate before and after the thermal process that is expressed as a percentage.

3-5. Evaluation of Continuous Moldability

By using a powder molding press machine (manufactured by Tamagawa Machinery Co., Ltd., S-20-A), the resin composition of each of the examples and comparative examples was made into tablets weighing 15 g and having a size of 018 mm and a height of about 30 mm, under a tabletting pressure of 600 Pa.

A tablet supply magazine loaded with the obtained tablets was set into a molding device. During the molding process, by using an automatic low-pressure transfer molding machine (manufactured by Dai-Ichi Seiki Co., Ltd., GP-ELF) as the molding device, a silicon chip and the like was encapsulated with the resin composition under conditions of a mold temperature of 175° C., a molding pressure of 9.8 MPa, and a curing time of 120 seconds so as to obtain a 80-pin QFP (having a lead frame made of Cu, external package size: 14 mm×20 mm×2.0 mm (thickness), pad size: 8.0 mm×8.0 mm, chip size: 7.0 mm×7.0 mm×0.35 mm (thickness)). The molding was continuously performed until the number of times thereof reached 700 shots.

At this time, at every 25 shots, the degree of contamination of the mold surface and the state of the formed package (whether or not the package has an unfilled portion) were confirmed. The shot number at which the contamination of the mold was initially confirmed or a mark "O" that was given when the mold was not contaminated was marked in the section of "mold surface state" of Tables 1 and 2. In addition, the shot number at which the unfilled portion was initially confirmed or a mark "O" that was given when there was no unfilled portion was marked in the section of "filling defectiveness" in Tables 1 and 2.

It is not preferable for the mold surface to be contaminated, since the contaminant is sometimes transferred onto the surface of the molded semiconductor device, or the contamination sometimes becomes a sing of formation of unfilled portion.

3-6. Evaluation of Koka's Viscosity

By using a Koka-type flow tester (manufactured by Shimadzu Corporation, CFT-500), a Koka's viscosity was measured under conditions of 125° C., a pressure of 40 kgf/cm$^2$, and a capillary diameter of 0.5 mm. The unit thereof was Pa·s.

3-7. Evaluation of Flexural Modulus

By using a low-pressure transfer molding machine (manufactured by Kohtaki Precision Machine Co., Ltd., KTS-30), the resin composition was injection-molded under conditions of a mold temperature of 175° C., an injection pressure of 9.8 MPa, and a curing time of 120 seconds, thereby obtaining a molded article having a length of 80 mm, a width of 10 mm, and a thickness of 4 mm. The obtained molded article was subjected to a post-curing process in which the molded articles was made into a test piece by being heated for 4 hours at 175° C., and a flexural modulus under heating thereof was measured based on JIS K 6911 at 260° C. in the atmosphere. The unit thereof is N/mm$^2$.

3-8. Evaluation of Water Absorption Rate

By using a low-pressure transfer molding machine (manufactured by Kohtaki Precision Machine Co., Ltd., KTS-30), the resin composition was injection-molded under conditions of a mold temperature of 175° C., an injection pressure of 7.4 MPa, and a curing time of 120 seconds, thereby preparing a test piece having a diameter of 50 mm and a thickness of 3 mm. The test piece was then subjected to post-curing for 4 hours at 175° C. Subsequently, the obtained test piece was subjected to a humidification process for 168 hours in an environment at 85° C. and a relative humidity of 85° C., and change in the weight before and after the humidification process was measured to determine a water absorption rate. The unit thereof is % (% by mass).

The evaluation results obtained as above from the resin composition of each of the examples, reference examples, and comparative examples are respectively shown in the following Tables 1 and 2.

TABLE 1

| | | Example | | | | | | | Reference Example | | Comparative Example | |
|---|---|---|---|---|---|---|---|---|---|---|---|---|
| | | a-1 | a-2 | a-3 | a-4 | a-5 | a-6 | a-7 | a-1 | a-2 | a-1 | a-2 |
| Phenol resin-based curing agent 1 | (MFBA-type phenol) | 5.34 | 5.07 | | 4.76 | 3.08 | 5.07 | 6.05 | 4.34 | 5.78 | | |
| Phenol resin-based curing agent 2 | (MFBA-type phenol) | | | 5.19 | | | | | | | | |
| Phenol resin-based curing agent 3 | (BA-type phenol) | | | | | 2.52 | | | | | 5.27 | |
| Phenol resin-based curing agent 4 | (TPM-type phenol) | | | | | | | | | | | 4.86 |
| Epoxy resin (a-1) | (MFBA-type epoxy) | 8.71 | 8.73 | | 4.97 | 8.21 | 8.73 | 10.55 | | | | |
| Epoxy resin (a-2) | (MFBA-type epoxy) | | | 8.61 | | | | | | | | |
| Epoxy resin (a-3) | (MFBA-type epoxy) | | | | | | | | | 8.27 | | |
| Epoxy resin (a-4) | (BA-type epoxy) | | | | 4.07 | | | | 9.46 | | 8.53 | |
| Epoxy resin (a-5) | (TPM-type epoxy) | | | | | | | | | | | 8.94 |
| Inorganic filler 1 | | 75 | 75 | 75 | 75 | 75 | 73.5 | 72 | 75 | 75 | 75 | 75 |
| Inorganic filler 2 | | 10 | 10 | 10 | 10 | 10 | 10 | 10 | 10 | 10 | 10 | 10 |
| Curing accelerator 1 | | 0.15 | | | | | | | | 0.15 | | |
| Curing accelerator 2 | | | 0.4 | 0.4 | 0.4 | 0.4 | 0.4 | 0.6 | 0.4 | | 0.4 | 0.4 |
| Silane coupling agent 1 | | 0.2 | 0.2 | 0.2 | 0.2 | 0.2 | 0.2 | 0.2 | 0.2 | 0.2 | 0.2 | 0.2 |
| Inorganic flame detardant 1 | | | | | | | 1.5 | | | | | |
| Wax | | 0.3 | 0.3 | 0.3 | 0.3 | 0.3 | 0.3 | 0.3 | 0.3 | 0.3 | 0.3 | 0.3 |
| Colorant | | 0.3 | 0.3 | 0.3 | 0.3 | 0.3 | 0.3 | 0.3 | 0.3 | 0.3 | 0.3 | 0.3 |
| Spiral flow [cm] | | 80 | 107 | 100 | 125 | 122 | 105 | 146 | 130 | 75 | 140 | 80 |
| Tg [DMA tanδ] | | 215 | 225 | 246 | 208 | 206 | 227 | 226 | 190 | 228 | 150 | 273 |
| Weight reduction rate (200° C./1000 hrs) [%] | | 0.08 | 0.08 | 0.10 | 0.07 | 0.07 | 0.1 | 0.09 | 0.11 | 0.08 | 0.05 | 0.45 |
| Flame resistance Rank of flame resistance | | V-0 | V-0 | V-0 | V-0 | V-0 | V-0 | V-0 | V-0 | V-0 | V-0 | burn down |
| Koka's viscosity [Pa·s] | | 11.2 | 7.7 | 8.0 | 6.2 | 6.3 | 8.4 | 4.6 | 4.5 | 10.8 | 4.8 | 10.2 |
| Flexural modulus [N/mm$^2$] at room temperature | | 16890 | 16900 | 17020 | 16820 | 16930 | 17125 | 17224 | 16780 | 17200 | 164200 | 18200 |
| Flexural modulus [N/mm$^2$] at 260° C. | | 2120 | 2200 | 2300 | 1980 | 2005 | 2250 | 2200 | 1995 | 2250 | 520 | 2350 |
| Water absorption rate (%) | | 0.32 | 0.33 | 0.34 | 0.31 | 0.31 | 0.33 | 0.33 | 0.27 | 0.33 | 0.16 | 0.45 |
| Continuous molding | Filling defectiveness | ○ | ○ | ○ | ○ | ○ | ○ | ○ | ○ | 600 | ○ | 225 |
| | Mold surface state | 650 | ○ | ○ | ○ | ○ | ○ | ○ | ○ | 550 | ○ | 200 |

Regarding Examples (a-2) to (a-7), Reference Examples (a-1) and (a-2), and Comparative Examples (a-1) and (a-2), as shown in Table 1, in each of the Examples (a-1) to (a-7), it was possible to simultaneously achieve the improvement of glass transition temperature (Tg) and the decrease of weight reduction rate of the cured material as well as excellent continuous moldability, with maintaining the flame resistance and fluidity of the cured material.

It was also found that in Examples (a-2) to (a-7) using the curing accelerator 2, which is one of the compounds represented by the Formulae (6) to (9), as a curing accelerator, the fluidity and moldability are far superior.

On the contrary, in Comparative Example (a-1), Tg was far lower than 200° C., and in Reference Example (a-1), the weight reduction rate was poorer than in examples. In Comparative Example (a-2), the flame resistance, weight reduction rate, fluidity, and continuous moldability were poor. In Reference Example (a-2), the value of M/(M+N), which is a feature of the present invention and is obtained when a total number of glycidyl ether group is regarded as M and a total number of hydroxyl group contained in each polymer is regarded as N, exceeded 0.97, and accordingly, the continuous moldability thereof was poorer than in examples. As a result, none of the comparative examples and reference examples are suitable for being used as a semiconductor encapsulating material of a package equipped with a semiconductor element such as SiC or GaN, or show the feature of the present invention that "makes it possible to prevent deterioration of resin even at a high temperature and thus enables the semiconductor element to operate for a long period of time". Moreover, the continuous moldability was poor in all of the comparative examples.

TABLE 2

| | | Example | | | | | | | Reference Example | Comparative Example | |
|---|---|---|---|---|---|---|---|---|---|---|---|
| | | b-1 | b-2 | b-3 | b-4 | b-5 | b-6 | b-7 | b-1 | b-1 | b-2 |
| Phenol resin-based curing agent 1 | (MFBA-type pheno) | 5.66 | 5.39 | | 4.95 | 3.26 | 5.39 | 6.44 | 4.34 | | |
| Phenol resin-based curing agent 2 | (MFBA-type pheno) | | | 5.28 | | | | | | | |
| Phenol resin-based curing agent 3 | (BA-type pheno) | | | | | 2.67 | | | | 5.27 | |
| Epoxy resin resin-based curing agent 4 | (TPM-type pheno) | | | | | | | | | | 4.86 |
| Epoxy resin (b-1) | (MFBA-type epoxy) | 8.39 | 8.41 | | 4.87 | 7.88 | 8.41 | 10.16 | | | |
| Epoxy resin (b-2) | (MFBA-type epoxy) | | | 8.52 | | | | | | | |
| Epoxy resin (b-3) | (MFBA-type epoxy) | | | | 3.98 | | | | 9.46 | 8.53 | |
| Epoxy resin (b-4) | (BA-type epoxy) | | | | | | | | | | 8.94 |
| Inorganic filler 1 | | 75 | 75 | 75 | 75 | 75 | 73.5 | 72 | 75 | 75 | 75 |
| Inorganic filler 2 | | 10 | 10 | 10 | 10 | 10 | 10 | 10 | 10 | 10 | 10 |
| Curing accelerator 1 | | 0.15 | | | | | | | | | |
| Curing accelerator 2 | | | 0.4 | 0.4 | 0.4 | 0.4 | 0.4 | 0.6 | 0.4 | 0.4 | 0.4 |
| Silane coupling agent 1 | | 0.2 | 0.2 | 0.2 | 0.2 | 0.2 | 0.2 | 0.2 | 0.2 | 0.2 | 0.2 |
| Inorganic flame retardant 1 | | | | | | | 1.5 | | | | |
| Wax | | 0.3 | 0.3 | 0.3 | 0.3 | 0.3 | 0.3 | 0.3 | 0.3 | 0.3 | 0.3 |
| Colorant | | 0.3 | 0.3 | 0.3 | 0.3 | 0.3 | 0.3 | 0.3 | 0.3 | 0.3 | 0.3 |
| Spiral flow [cm] | | 75 | 100 | 85 | 120 | 120 | 100 | 140 | 130 | 140 | 80 |
| Tg [DMA tanδ] | | 220 | 230 | 250 | 210 | 210 | 230 | 230 | 190 | 150 | 270 |
| Weight reduction rate (200° C./1000 hrs) [%] | | 0.08 | 0.09 | 0.10 | 0.07 | 0.07 | 0.1 | 0.09 | 0.11 | 0.05 | 0.41 |
| Flame resistance Rank of flame resistance | | V-0 | V-0 | V-0 | V-0 | V-0 | V-0 | V-0 | V-0 | V-0 | burn down |
| Koka's viscosity [Pa · s] | | 11.2 | 8.4 | 9.5 | 5.3 | 6.4 | 9.0 | 4.7 | 5.5 | 4.2 | 10.3 |
| Flexural modulus [N/mm²] at room temperature | | 16800 | 16900 | 17050 | 16890 | 16720 | 16900 | 16880 | 16660 | 16540 | 18180 |
| Flexural modulus [N/mm²] at 260° C. | | 2195 | 2100 | 2200 | 2050 | 2040 | 2090 | 2085 | 1950 | 530 | 2520 |
| Water absorption rate [%] | | 0.31 | 0.33 | 0.34 | 0.29 | 0.29 | 0.33 | 0.33 | 0.26 | 0.16 | 0.44 |
| Continuous molding | Filling defectiveness | ○ | ○ | ○ | ○ | ○ | ○ | ○ | ○ | ○ | 225 |
| | Mold surface state | 650 | ○ | ○ | ○ | ○ | ○ | ○ | ○ | ○ | 220 |

Regarding Examples (b-2) to (b-7), Reference Example (b-1), and Comparative Examples (b-1) and (b-2), as shown in Table 2, in each of the Examples (b-1) to (b-7), it was possible to simultaneously achieve both the improvement of glass transition temperature (Tg) and the decrease of weight reduction rate of the cured material, with maintaining the flame resistance of the cured material and filling properties in the continuous moldability as one of the molding properties.

On the contrary, in Comparative Example (b-1), Tg was far lower than 200° C., and in Reference Example (b-1), the weight reduction rate was poorer than in examples. In Comparative Example (b-2), the flame resistance, weight reduction rate, fluidity, and continuous moldability were poor. As a result, none of the comparative examples and the reference example are suitable for being used as a semiconductor encapsulating material of a package equipped with a semiconductor element such as SiC or GaN, or show the feature of the present invention that "makes it possible to prevent deterioration of resin even at a high temperature and thus enables the semiconductor element to operate for a long period of time".

The invention claimed is:

1. A resin composition for encapsulation comprising:
   a phenol resin curing agent; and
   an epoxy resin,
   wherein the epoxy resin is an epoxy resin represented by Formula (2A),

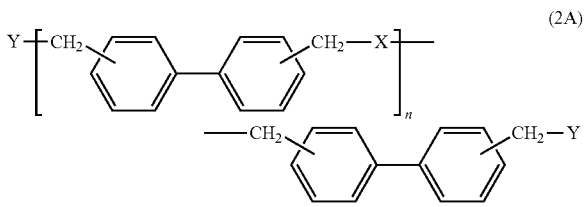

(2A)

wherein in Formula (2A), each of the two Ys independently represents a glycidylated phenyl group represented by Formula (2B) or Formula (2C); X represents a glycidylated phenylene group represented by Formula (2D) or Formula (2E); n represents a number equal to or greater than 0; and when n is equal to or greater than 2, each of two or more Xs may be independently the same as or different from each other,

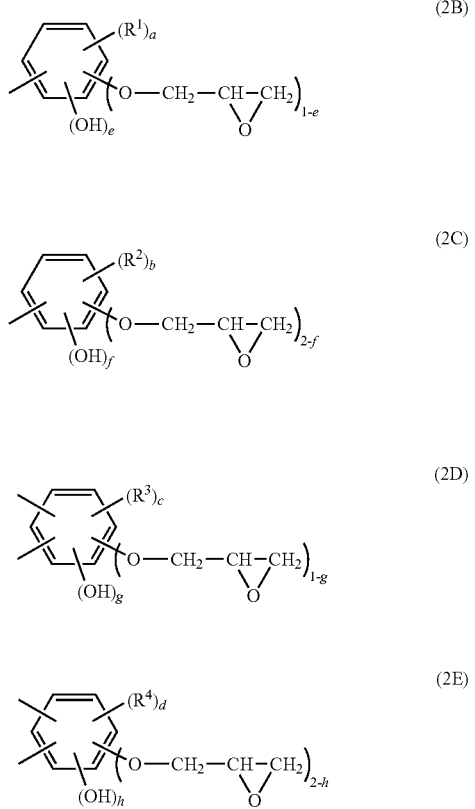

wherein in Formulae (2B) to (2E), each of $R^1$, $R^2$, $R^3$, and $R^4$ independently represents a hydrocarbon group having 1 to 5 carbon atoms; a represents an integer of 0 to 4; b represents an integer of 0 to 3; c represents an integer of 0 to 3; d represents an integer of 0 to 2; each of e and g independently represents an integer of 0 or 1; and each of f and h independently represents an integer of 0 to 2,
wherein a total number of glydicyl ether groups contained in the epoxy resin is M, and a total number of hydroxyl groups contained in the epoxy resin is N, a value of M/(M+N) is equal to or greater than 0.50 and equal to or less than 0.97.

2. The resin composition for encapsulation according to claim 1,
wherein the phenol resin curing agent is a phenol resin curing agent represented by Formula (1A), and a hydroxyl equivalent of the phenol resin curing agent is equal to or more than 90 g/eq and equal to or less than 190 g/eq,

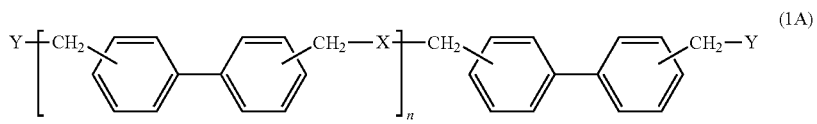

wherein in Formula (1A), each of the two Ys independently represents a hydroxyphenyl group represented by Formula (1B) or Formula (1C); X represents a hydroxyphenylene group represented by Formula (1D) or Formula (1E); n represents a number equal to or greater than 0; and when n is equal to or greater than 2, each of two or more Xs may be independently the same or different from each other,

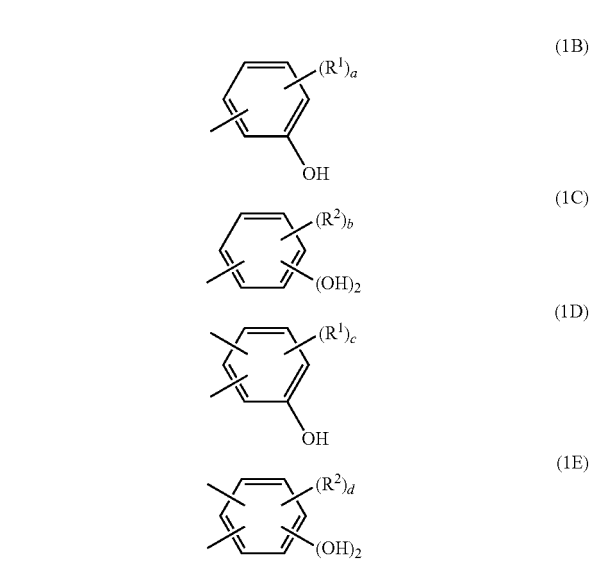

wherein in Formulae (1B) to (1E), each of $R^1$ and $R^2$ independently represents a hydrocarbon group having 1 to 5 carbon atoms; a represents an integer of 0 to 4; b represents an integer of 0 to 3; c represents an integer of 0 to 3; and d represents an integer of 0 to 2.

3. The resin composition for encapsulation according to claim 1, wherein an epoxy equivalent of the epoxy resin is equal to or more than 160 g/eq and equal to or less than 290 g/eq.

4. The resin composition for encapsulation according to claim 1,
wherein the phenol resin curing agent is a phenol resin curing agent represented by Formula (1A),

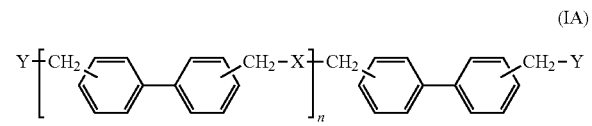

wherein in Formula (1A), each of two Ys independently represents a hydroxyphenyl group represented by Formula (1B) or Formula (1C); X represents a hydroxyphenylene group represented by Formula (1D) or Formula (1E); n represents a number equal to or greater than 0;

and when n is equal to or greater than 2, each of two or more Xs may be independently the same as or different from each other, (1B)

[chemical structure: phenyl ring with $(R^1)_a$ substituents and OH]

(1C)

[chemical structure: phenyl ring with $(R^2)_b$ substituents and $(OH)_2$]

(1D)

[chemical structure: phenyl ring with $(R^1)_c$ substituents and OH]

(1E)

[chemical structure: phenyl ring with $(R^2)_d$ substituents and $(OH)_2$]

wherein in Formulae (1B) to (1E), each of $R^1$ and $R^2$ independently represents a hydrocarbon group having 1 to 5 carbon atoms; a represents an integer of 0 to 4; b represents an integer of 0 to 3; c represents an integer of 0 to 3; and d represents an integer of 0 to 2.

5. The resin composition for encapsulation according to claim 1,
wherein when a content of the phenol resin curing agent in the resin composition is A1 (% by mass), and a content of the epoxy resin in the resin composition is A2 (% by mass), a value of A1/(A1+A2) is equal to or greater than 0.2 and equal to or less than 0.9.

6. A resin composition for encapsulation comprising:
a phenol resin curing agent; and
an epoxy resin,
wherein a glass transition temperature (Tg) of a cured material of the resin composition for encapsulation is equal to or higher than 200° C., and when the cured material is heated for 1,000 hours at 200° C. in the atmosphere, a weight reduction rate of the cured material becomes equal to or lower than 0.3%,
wherein the epoxy resin is an epoxy resin represented by Formula (2A), and provided that a total number of glycidyl ether groups contained in the epoxy resin is M, and a total number of hydroxyl groups contained in the epoxy resin is N, a value of M/(M+N) is equal to or greater than 0.50 and equal to or less than 0.97, wherein in Formula (2A), each of the two Ys independently represents a glycidylated phenyl group represented by Formula (2B) or Formula (2C); X represents a glycidylated phenylene group represented by Formula (2D) or Formula (2E) n represents a number equal to or greater than 0; and when n is equal to or greater than 2, each of two or more Xs may be independently the same as or different from each other, (2B)

[chemical structure: phenyl with $(R^1)_a$, $(OH)_e$, $(O-CH_2-CH-CH_2)_{1-e}$ with epoxide]

(2C)

[chemical structure: phenyl with $(R^2)_b$, $(OH)_f$, $(O-CH_2-CH-CH_2)_{2-f}$ with epoxide]

(2D)

[chemical structure: phenylene with $(R^3)_c$, $(OH)_g$, $(O-CH_2-CH-CH_2)_{1-g}$ with epoxide]

(2E)

[chemical structure: phenylene with $(R^4)_d$, $(OH)_h$, $(O-CH_2-CH-CH_2)_{2-h}$ with epoxide]

wherein in Formulae (2B) to (2E), each of $R^1$, $R^2$, $R^3$, and $R^4$ independently represents a hydrocarbon group having 1 to 5 carbon atoms; a represents an integer of 0 to 4; b represents an integer of 0 to 3; c represents an integer of 0 to 3; d represents an integer of 0 to 2; each of e and g independently represents an integer of 0 or 1; and each of f and h independently represents an integer of 0 to 2.

7. The resin composition for encapsulation according to claim 6,
wherein the phenol resin curing agent is a phenol resin curing agent represented by Formula (1A), (2A)

$$Y\!\!-\!\!\left[\text{CH}_2\!\!-\!\!\underset{}{\bigcirc}\!\!-\!\!\underset{}{\bigcirc}\!\!-\!\!\text{CH}_2\!\!-\!\!X\right]_n\!\!-\!\!\text{CH}_2\!\!-\!\!\underset{}{\bigcirc}\!\!-\!\!\underset{}{\bigcirc}\!\!-\!\!\text{CH}_2\!\!-\!\!Y$$

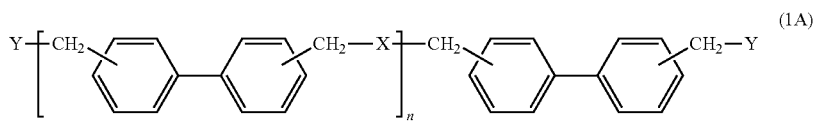

wherein in Formula (1A), each of the two Ys independently represents a hydroxyphenyl group represented by Formula (1B) or Formula (1C); X represents a hydroxyphenylene group represented by Formula (1D) or Formula (1E); n represents a number equal to or greater than 0; and when n is equal to or greater than 2, each of two or more Xs may be independently the same as or different from each other,

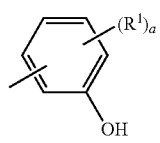

(1B)

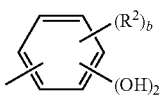

(1C)

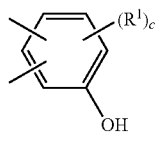

(1D)

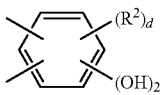

(1E)

wherein Formulae (1B) to (1E), each of $R^1$ and $R^2$ independently represents a hydrocarbon group having 1 to 5 carbon atoms; a represents an integer of 0 to 4; b represents an integer of 0 to 3; c represents an integer of 0 to 3; and d represents an integer of 0 to 2.

8. The resin composition for encapsulation according to claim 6,
wherein the phenol resin curing agent is a phenol resin curing agent represented by Formula (1A), and a hydroxyl equivalent of the phenol resin curing agent is equal to or more than 90 g/eq and equal to or less than 190 g/eq,

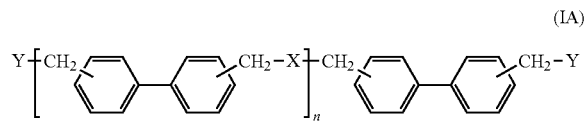

(1A)

wherein in Formula (1A), each of the two Ys independently represents a hydroxyphenyl group represented by Formula (1B) or Formula (1C); X represents a hydroxyphenylene group represented by Formula (1D) or Formula (1E); n represents a number equal to or greater than 0; and when n is equal to or greater than 2, each of two or more Xs may be independently the same as or different from each other,

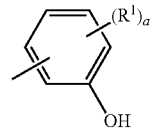

(1B)

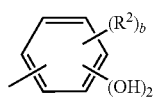

(1C)

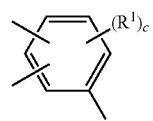

(1D)

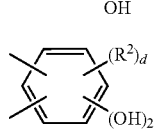

(1E)

wherein in Formulae (1B) to (1E), each of $R^1$ and $R^2$ independently represents a hydrocarbon group having 1 to 5 carbon atoms; a represents an integer of 0 to 4; b represents an integer of 0 to 3; c represents an integer of 0 to 3; and d represents an integer of 0 to 2.

9. The resin composition for encapsulation according to claim 6,
wherein an epoxy equivalent of the epoxy resin is equal to or more than 160 g/eq and equal to or less than 290 g/eq.

10. The resin composition for encapsulation according to claim 6,
wherein when a content of the phenol resin curing agent in the resin composition is A1 (% by mass), and a content of the epoxy resin in the resin composition is A2 (% by mass), a value of A1/(A1+A2) is equal to or greater than 0.2 and equal to or less than 0.9.

11. The resin composition for encapsulation according to claim 1, that has a Koka's viscosity of equal to or higher than 1 Pa·s and equal to or lower than 14 Pa·s.

12. The resin composition for encapsulation according to claim 1,
wherein the cured material of the resin composition for encapsulation has a flexural modulus at 260° C. of equal to or greater than 1,500 N/mm² and equal to or less than 2,500 N/mm².

13. The resin composition for encapsulation according to claim 1, that has a water absorption rate of equal to or higher than 0.1% and equal to or lower than 0.35%.

14. An electronic device comprising electronic components encapsulated with the resin composition for encapsulation according to claim 1.

* * * * *